United States Patent
An et al.

(10) Patent No.: US 11,601,537 B2
(45) Date of Patent: Mar. 7, 2023

(54) ELECTRONIC DEVICE INCLUDING DISPLAY

(71) Applicant: SAMSUNG ELECTRONICS CO., LTD., Suwon-si (KR)

(72) Inventors: Jungchul An, Suwon-si (KR); Jinkyung Lee, Suwon-si (KR); Jongki Park, Suwon-si (KR); Jungbae Bae, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/336,686

(22) Filed: Jun. 2, 2021

(65) Prior Publication Data
US 2021/0385314 A1    Dec. 9, 2021

(30) Foreign Application Priority Data
Jun. 4, 2020 (KR) ........................ 10-2020-0067907

(51) Int. Cl.
*H04M 1/02* (2006.01)
*G02F 1/1335* (2006.01)
*H04M 1/22* (2006.01)

(52) U.S. Cl.
CPC .... *H04M 1/0266* (2013.01); *G02F 1/133512* (2013.01); *H04M 1/0264* (2013.01); *H04M 1/22* (2013.01)

(58) Field of Classification Search
CPC ............. H01L 27/3276; H01L 27/3234; H01L 27/3218; H01L 27/326; H01L 27/3246; H01L 27/3216; H01L 27/3267; H01L 27/3288; H01L 25/167; H01L 27/124; H01L 27/3211; H01L 27/3281; H01L 51/5253; H01L 25/18; H01L 27/1225;
(Continued)

(56) References Cited

U.S. PATENT DOCUMENTS 8,947,627 B2    2/2015 Rappoport et al.
9,437,132 B2    9/2016 Rappoport et al.
(Continued)

FOREIGN PATENT DOCUMENTS

CN    110061014    7/2019
CN    110264894    9/2019
(Continued)

OTHER PUBLICATIONS

International Search Report and Written Opinion dated Oct. 1, 2021 in corresponding International Application No. PCT/KR2021/006972.

*Primary Examiner* — Golam Sorowar
(74) *Attorney, Agent, or Firm* — Nixon & Vanderhye P.C.

(57) ABSTRACT

An electronic device is provided. The electronic device includes: a display panel including a display area in which a plurality of pixels are arranged and configured to display an image in a first direction, and a first camera module including camera circuitry and a second camera module including camera circuitry arranged under the display panel, wherein the display area includes a first display area overlapping the first camera module in the first direction and a second display area overlapping the second camera module in the first direction, wherein pixels per inch (PPI) of the first display area is less than the PPI of the second display area.

20 Claims, 22 Drawing Sheets

(58) Field of Classification Search
CPC .............. H01L 27/1266; H01L 27/3213; H01L 27/3225; H01L 27/3248; H01L 27/3262; H01L 29/78648; H01L 51/5218; H01L 2251/301; H01L 2251/306; H01L 2251/308; H01L 27/14603; H04N 5/2257; H04N 5/2253; H04N 5/2254; H04N 5/2258; H04N 5/23293; H04N 13/344; H04N 13/383; H04N 5/2252; H04N 5/22525; H04N 5/23229; H04N 5/23232; H04N 5/23235; H04N 5/23287; H04N 5/3696; H04N 5/2259; H04N 5/232; H04N 5/247; H04N 13/117; H04N 13/167; H04N 13/239; H04N 13/302; H04N 5/217; H04N 5/22541; H04N 5/23238; H04N 5/232935; H04N 5/232945; H04N 5/23299; G09G 2300/0426; G09G 2300/0452; G09G 2340/0407; G09G 3/20; G09G 2320/0233; G09G 2310/0232; G09G 2320/0686; G09G 2320/0693; G09G 3/3208; G09G 3/2003; G09G 2320/0238; G09G 2320/0242; G09G 2340/14; G09G 2356/00; G09G 2370/12; G09G 2300/0465; G09G 3/2074; G09G 3/3233; G09G 2300/0842; G09G 3/3225; G09G 2300/0443; G09G 2320/0626; G09G 2360/144

See application file for complete search history.

(56) References Cited

U.S. PATENT DOCUMENTS

| | | | |
|---|---|---|---|
| 9,543,364 B2 | 1/2017 | Rappoport et al. | |
| 9,825,103 B2 | 11/2017 | Rappoport et al. | |
| 10,019,940 B2 | 7/2018 | Rappoport et al. | |
| 10,121,831 B2 | 11/2018 | Rappoport et al. | |
| 10,431,636 B2 | 10/2019 | Rappoport et al. | |
| 10,546,901 B2 | 1/2020 | Rappoport et al. | |
| 10,756,136 B1 | 8/2020 | Ma et al. | |
| 10,879,318 B2 | 12/2020 | Rappoport et al. | |
| 11,048,306 B2 | 6/2021 | Kwak et al. | |
| 11,082,547 B2 | 8/2021 | Xu et al. | |
| 2012/0320307 A1* | 12/2012 | Aichi | H01L 27/1446 349/110 |
| 2013/0094126 A1 | 4/2013 | Rappoport et al. | |
| 2016/0358543 A1 | 12/2016 | Rappoport et al. | |
| 2019/0212788 A1 | 7/2019 | Kwak et al. | |
| 2019/0339745 A1* | 11/2019 | Chen | H04M 1/0214 |
| 2019/0347984 A1* | 11/2019 | Hintermeister | G09G 3/3208 |
| 2020/0098341 A1* | 3/2020 | Ko | H01L 27/3272 |
| 2020/0195764 A1* | 6/2020 | Xu | H04N 5/2257 |
| 2020/0196471 A1* | 6/2020 | Wang | G06F 1/1656 |
| 2021/0065625 A1 | 3/2021 | Wang et al. | |
| 2021/0091146 A1 | 3/2021 | Rappoport et al. | |
| 2021/0167138 A1* | 6/2021 | Xiao | H01L 51/5225 |
| 2021/0325943 A1 | 10/2021 | Kwak et al. | |
| 2021/0358379 A1* | 11/2021 | Li | H01L 27/326 |
| 2021/0408499 A1 | 12/2021 | Li et al. | |
| 2022/0020323 A1* | 1/2022 | Choi | G09G 3/3225 |

FOREIGN PATENT DOCUMENTS

| | | |
|---|---|---|
| CN | 110365819 A | 10/2019 |
| CN | 110444125 A | 11/2019 |
| CN | 110914891 | 3/2020 |
| EP | 3624434 | 3/2020 |
| KR | 10-2012-0104480 | 9/2012 |
| KR | 10-2019-0084397 | 7/2019 |

* cited by examiner

ELECTRONIC DEVICE INCLUDING DISPLAY

CROSS-REFERENCE TO RELATED APPLICATION

This application is based on and claims priority under 35 U.S.C. § 119 to Korean Patent Application Serial No. 10-2020-0067907, filed on Jun. 4, 2020, in the Korean Intellectual Property Office, the disclosure of which is incorporated by reference herein in its entirety.

BACKGROUND

Field

The disclosure relates to an electronic device including a display.

Description of Related Art

Electronic devices including a display panel such as a liquid crystal display panel, an organic light-emitting display panel, and the like are widely used. A display panel may display an image using a plurality of pixels arranged in a display area. A display may include signal lines and driving units for driving pixels. The electronic devices may include a non-display area achieved by removing pixels from the display area in which a camera module is positioned so as not to display an image in the display area in which the camera module is positioned.

If the non-display area of a display panel is large, the non-display area may be easily visually recognized by a user, and an area for displaying an image in the display panel may be limited. Therefore, the display area may be extended by arranging pixels in the display area in which the camera module is positioned. In the case where the camera module is arranged under an active area (e.g., screen display area) of the display panel, the quantity of light incident on the camera module and obtained image quality may be determined according to the density of pixels positioned in a path of light incident on the camera module.

SUMMARY

Embodiments of the disclosure provide an electronic device which improves the quality of an image obtained using a camera module.

Embodiments of the disclosure provide an electronic device capable of obtaining an image by selectively using at least two camera modules based on an external illumination value of an electronic device.

In accordance with an example embodiment, an electronic device includes: a display panel including a display area in which a plurality of pixels are arranged and configured to display an image in a first direction, and a first camera module including camera circuitry and a second camera module including camera circuitry arranged under the display panel, wherein the display area includes a first display area overlapping the first camera module in the first direction and a second display area overlapping the second camera module in the first direction, wherein pixels per inch (PPI) of the first display area is less than the PPI of the second display area.

In accordance with an example embodiment, an electronic device includes: a display panel including a display area in which a plurality of pixels are arranged and configured to display an image in a first direction, a display driver integrated circuit (IC) electrically connected to the display panel, a processor electrically connected to the display driver IC, and a first camera module including camera circuitry and a second camera module including camera circuitry arranged under the display panel and configured to obtain an image using light transmitted through the display panel, wherein the display area includes a first display area overlapping the first camera module in the first direction and the second display area overlapping the second camera module in the first direction, wherein pixels per inch (PPI) of the first display area is less than the PPI of the second display area, and wherein the processor is configured to control the electronic device to obtain an image using at least one of the first camera module or the second camera module.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With respect to the description of the drawings, the same or similar reference signs may be used for the same or similar elements.

DETAILED DESCRIPTION

Figure 1:
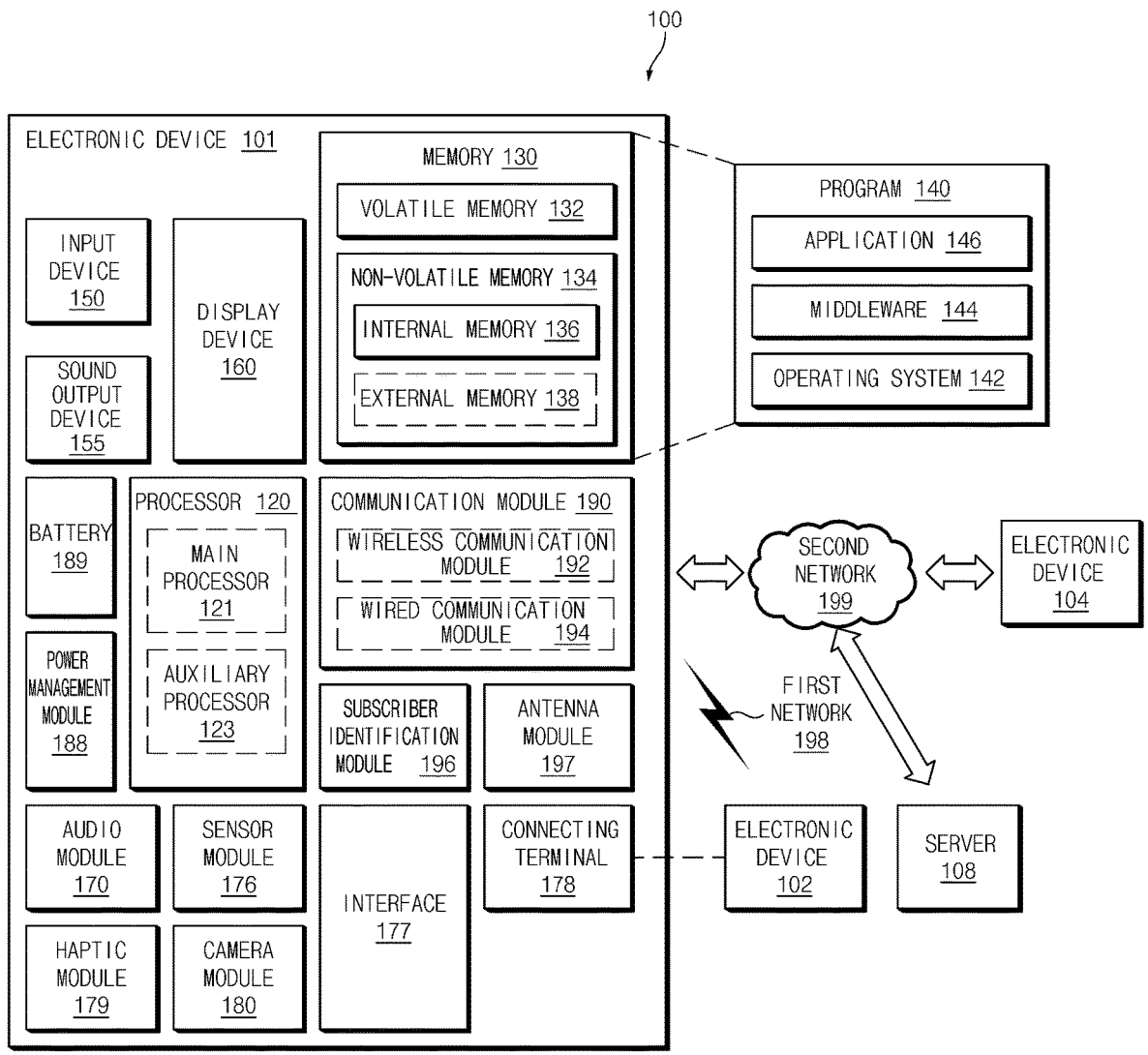
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™' wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
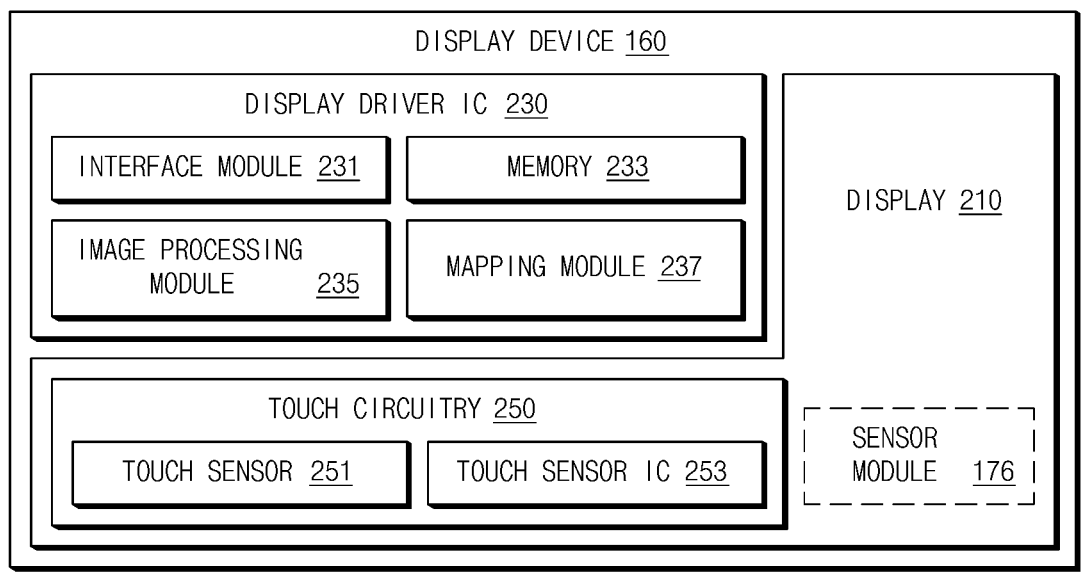
FIG. 2 is a block diagram illustrating an example display device according to various embodiments.

FIG. 2 is a block diagram 200 illustrating the display device 160 according to various embodiments. Referring to FIG. 2, the display device 160 may include a display 210 and a display driver integrated circuit (DDI) 230 to control the display 210. The DDI 230 may include an interface module (e.g., including interface circuitry) 231, memory 233 (e.g., buffer memory), an image processing module (e.g., including image processing circuitry and/or executable program elements) 235, and/or a mapping module (e.g., including mapping circuitry and/or executable program elements) 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 150 or the sensor module 176 via the interface module 231. The DDI 230 may also store at least part of the received image information in the memory 233, for example, on a frame by frame basis.

The image processing module 235 may include various processing circuitry and/or executable program elements and perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may include various mapping circuitry and/or executable program elements and generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 150)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

An electronic device 300 according to various embodiments will be described in greater detail below with reference to FIGS. 3 and 4.

Figure 3:
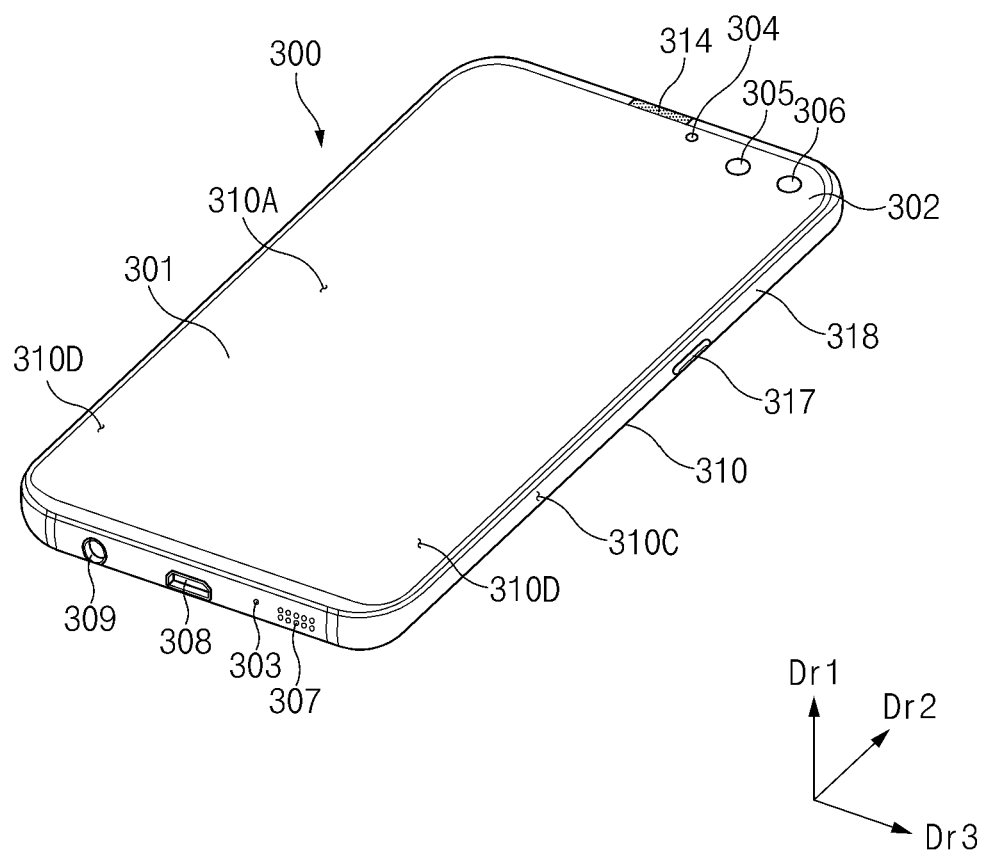
FIG. 3 is a front perspective view of an electronic device according to various embodiments.

FIG. 3 is a front perspective view of the electronic device 300 according to various embodiments. FIG. 4 is a rear perspective view of the electronic device 300 according to various embodiments.

Figure 4:
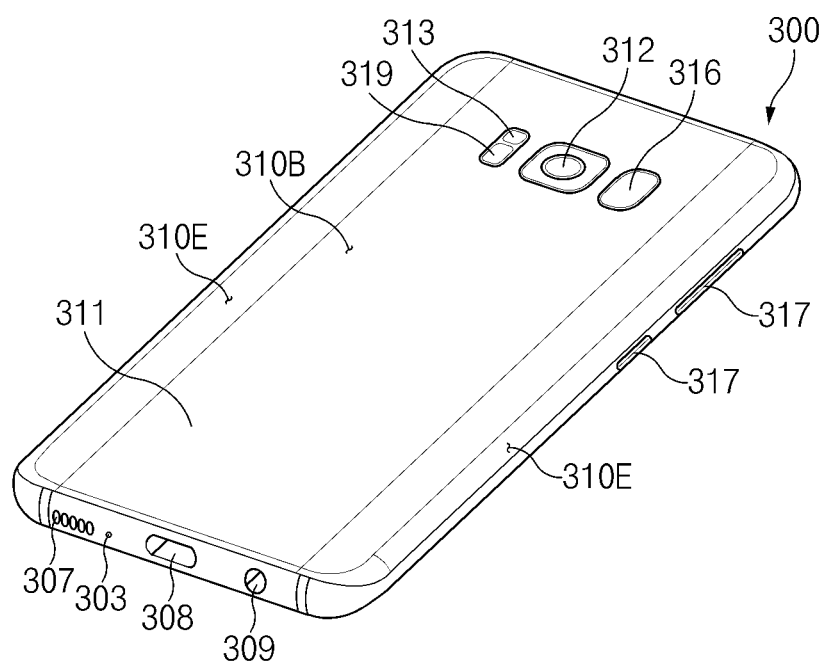
FIG. 4 is a rear perspective view of an electronic device according to various embodiments.

Referring to FIGS. 3 and 4, the electronic device 300 according to an embodiment may include a housing 310 including a first surface (or front surface) 310A, a second surface (or rear surface) 310B, and a side surface 310C surrounding a space between the first surface 310A and the second surface 310B. In an embodiment (not shown), the housing 310 may refer to a structure forming a portion of the first surface 310A, the second surface 310B, and the side surface 310C of FIG. 3. According to an embodiment, at least a portion of the first surface 310A may be formed by a front plate 302 (e.g., a glass plate including various coating layers, or a polymer plate) that is substantially transparent. The second surface 310B may be formed by a rear plate 311 that is substantially opaque. The rear plate 311 may be formed by, for example, coated or colored glass, ceramic, polymer, metal (e.g., aluminum, stainless steel (STS), or magnesium), or a combination of at least two of the foregoing materials. The first surface 310A and the second surface 310B may overlap each other in a first direction Dr1. The side surface 310C may be coupled to the front plate 302 and the rear plate 311, and may be formed by a side bezel structure (or "side member") 318 including metal and/or polymer. The side bezel structure 318 may include a portion extending in a second direction Dr2 perpendicular to the first direction Dr1 and another portion extending in a third direction Dr3 perpendicular to the first direction Dr1 and the second direction Dr2. In some embodiments, the rear plate 311 and the side bezel structure 318 may be integrally formed and may include the same material (e.g., a metal material such as aluminum).

In the illustrated embodiment, the front plate 302 may include, on both of long edges of the front plate 302, two first areas 310D bent and seamlessly extending from the first surface 310A towards the rear plate 311. In the illustrated embodiment (see FIG. 4), the rear plate 311 may include, on both of long edges, two second areas 310E bent and seamlessly extending from the second surface 310B towards the front plate 302. In some embodiments, the front plate 302 (or the rear plate 311) may include only one of the first areas 310D (or the second areas 310E). In an embodiment, a portion of the first areas 310D or the second areas 310E may not be included. In the above embodiments, in a side view of the electronic device 300, the side bezel structure 318 may have a first thickness (or width) on a side that does not include the first areas 310D or the second areas 310E and a second thickness smaller than the first thickness on a side that includes the first areas 310D or the second areas 310E.

According to an embodiment, the electronic device 300 may include at least one of a display 301, audio modules 303, 307, and 314, sensor modules 304, 316, and 319, camera modules 305, 306, 312, and 313, a key input device 317, or connector holes 308 and 309. In some embodiments, the electronic device 300 may not include at least one of components (e.g., the key input device 317) or may further include other components.

The display 301, for example, may be visible or viewable through a significant portion of the front plate 302. In some embodiments, at least a portion of the display 301 may be visible through the first surface 310A and the front plate 302 forming the first areas 310D of the side surface 310C. In some embodiments, corners of the display 301 may be formed in a shape that is approximately the same as a shape of an adjacent outer contour of the front plate 302. In an embodiment (not shown), in order to extend an exposed area of the display 301, the corners of the display 301 may be formed so that a distance between an outer contour of the display 310 and the outer contour of the front plate 302 is approximately constant.

According to an embodiment, a rear of a screen display area of the display 301 may include at least one of the audio module 314, the sensor module 304, the camera modules 305 and 306, or the fingerprint sensor 316. In an embodiment (not shown), the display 301 may be combined with or arranged adjacent to a touch sensing circuit, a pressure sensor capable of measuring strength (pressure) of a touch, and/or a digitizer that detects a magnetic stylus pen. In some embodiments, at least a portion of the sensor modules 304 and 319 and/or at least a portion of the key input devices 317 may be arranged in the first areas 310D and/or the second areas 310E.

The audio modules 303, 307, and 314 may include a microphone hole 303 and speaker holes 307 and 314. The microphone hole 303 may have a microphone arranged therein to obtain an external sound, and, in some embodiments, a plurality of microphones may be arranged to sense a direction of a sound. The speaker holes 307 and 314 may include an external speaker hole 307 and a receiver hole 314 for a phone call. In some embodiments, the speaker holes 307 and 314 and the microphone hole 303 may be implemented as a single hole, or a speaker (e.g., a piezo speaker) may be included without the speaker holes 307 and 314.

The sensor modules 304, 316, and 319 may generate an electrical signal or data value corresponding to an internal operation state of the electronic device 300 or an external environment state. The sensor modules 304, 316, and 319 may include, for example, a first sensor module 304 (e.g., an illumination sensor) and/or a second sensor module (not shown) (e.g., a fingerprint sensor) arranged in the first surface 310A of the housing 310, and/or a third sensor module 319 (e.g., an HRM sensor) and/or a fourth sensor module 316 (e.g., a fingerprint sensor) arranged in the second surface 310B of the housing 310. The fingerprint sensor may be arranged not only in the first surface 310A of the housing 310 but also in the second surface 310B. The electronic device 300 may further include sensor modules not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or a proximity sensor.

The camera modules 305, 306, 312, and 313 may include a first camera module 305 and a second camera module 306 arranged in the first surface 310A of the electronic device 300. Furthermore, the camera modules 305, 306, 312, and 313 may include a third camera module 312 and/or a flash 313 arranged in the second surface 310B. The camera modules 305, 306, and 312 may include one or more lenses, an image sensor, and/or an image signal processor. The flash 313 may include, for example, a light-emitting diode or xenon lamp. In some embodiments, two or more lenses (an infrared camera, wide-angle and telephoto lenses) and image sensors may be arranged in one surface of the electronic device 300. The first camera module 305 and the second camera module 306 may be arranged so as to perform functions thereof without being visually exposed through the front plate 302 while the display 301 is displaying an image.

The key input devices 317 may be arranged in the side surface 310C of the housing 310. In an embodiment, the electronic device 300 may not include a portion or all of the above-mentioned key input devices 317, and the key input devices 317 that are not included may be implemented in other forms such as a soft key or the like on the display 301. In some embodiments, the key input devices may include the sensor module 316 arranged in the second surface 310B of the housing 310.

The connector holes 308 and 309 may include a first connector hole 308 capable of accommodating a connector (e.g., a USB connector) for transmitting/receiving power and/or data to or from an external electronic device and/or a second connector hole 309 (e.g., an earphone jack) capable of accommodating a connector for transmitting/receiving an audio signal to or from an external electronic device.

According to an embodiment, the electronic device 300 may further include a light-emitting device (not shown). The light-emitting device, for example, may be arranged in the first surface 310A of the housing 310. The light-emitting device, for example, may provide state information about the electronic device 300 in a form of light. In an embodiment, the light-emitting device, for example, may provide a light source linked with operation of the camera module 305. The light-emitting device may include, for example, an LED, an IR LED, and a xenon lamp.

Figure 5:
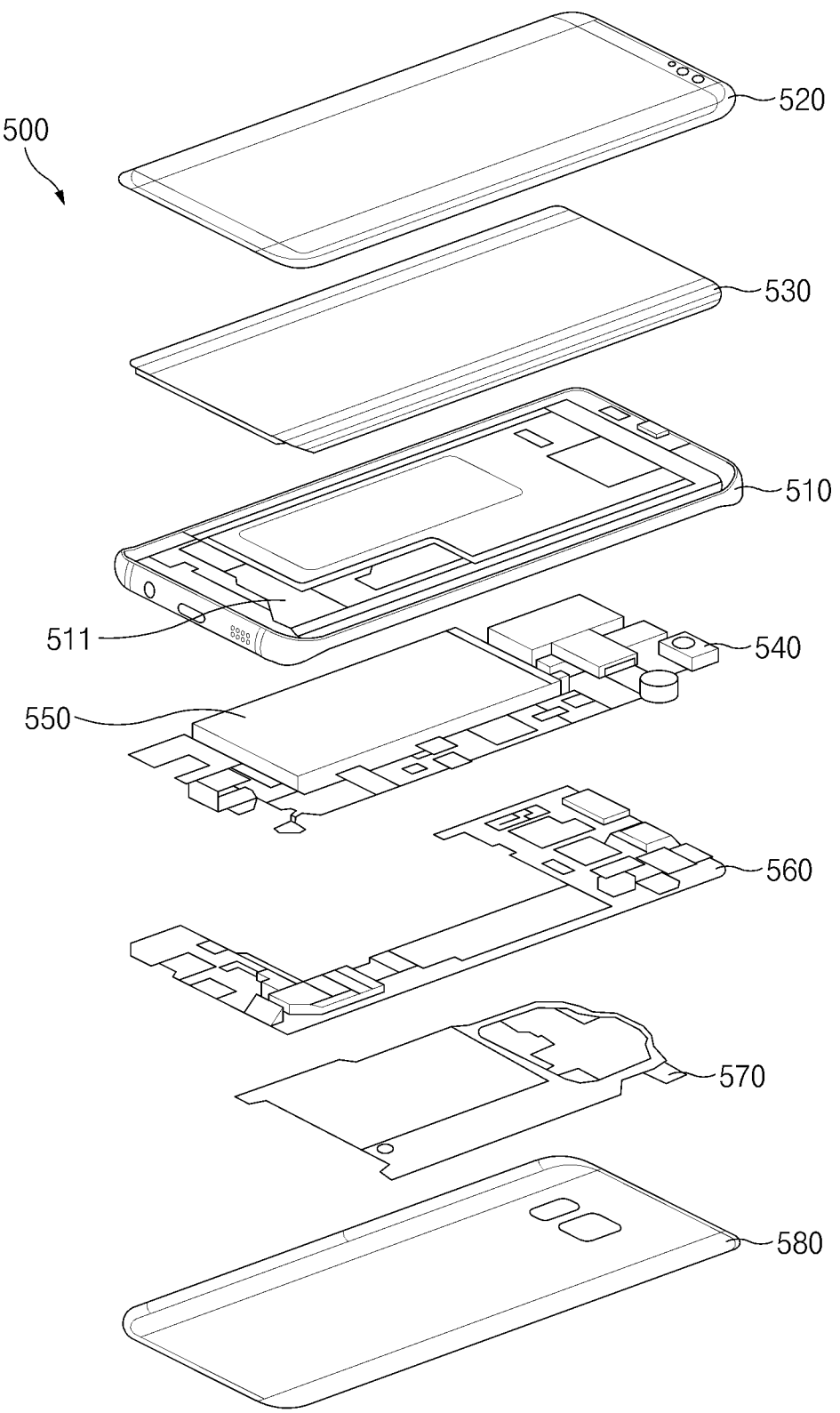
FIG. 5 is an exploded perspective view of an electronic device according to various embodiments.

FIG. 5 is an exploded perspective view of an electronic device according to various embodiments. Referring to FIG. 5, an electronic device 500 may include a side bezel structure 510, a first support member 511 (e.g., a bracket), a front plate 520, a display 530, a printed circuit board 540, a battery 550, a second support member 560 (e.g., a rear case), an antenna 570, and a rear plate 580. In some embodiments, the electronic device 500 may not include at least one of components (e.g., the first support member 511 or the second support member 560) or may further include other components. At least one of the components of the electronic device 500 may be the same as or similar to at least one of the components of the electronic device 300 of FIG. 3 or 4, and overlapping descriptions are not provided below.

The first support member 511 may be disposed in the electronic device 500 and connected to the side bezel structure 510 or may be integrated with the side bezel structure 510. The first support member 511 may be formed of, for example, a metallic material and/or non-metallic material (e.g., polymer). The first support member 511 may have one surface to which the display 530 is coupled and another surface to which the printed circuit board 540 is coupled. The printed circuit board 540 may be mounted with a processor, a memory, and/or an interface. The processor may include, for example, at least one of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 500 to an external electronic device, and may include a USB connector, an SD card/MMC connector, or an audio connector.

The battery 550, which is a device for supplying power to at least one of the components of the electronic device 500, may include, for example, a primary cell which is not rechargeable, a secondary cell which is rechargeable, or a fuel cell. At least a portion of the battery 550, for example, may be substantially flush with the printed circuit board 540. The battery 550 may be integrally arranged in the electronic device 500 or may be arranged so as to be detachable from the electronic device 500.

The antenna 570 may be arranged between the rear plate 580 and the battery 550. The antenna 570 may include, for example, a near field communication (NFC) antenna, a wireless charging antenna, and/or a magnetic secure transmission (MST) antenna. The antenna 570, for example, may perform short-range communication with an external device or may wirelessly transmit/receive power required for charging. In an embodiment, an antenna structure may be formed by a portion or combination of the side bezel structure 510 and/or the first support member 511.

Hereinafter, a display panel 600 included in an electronic device (e.g., the electronic device 300 of FIG. 3) according to various embodiments will be described in greater detail below with reference to FIGS. 6, 7 and 8.

Figure 6:
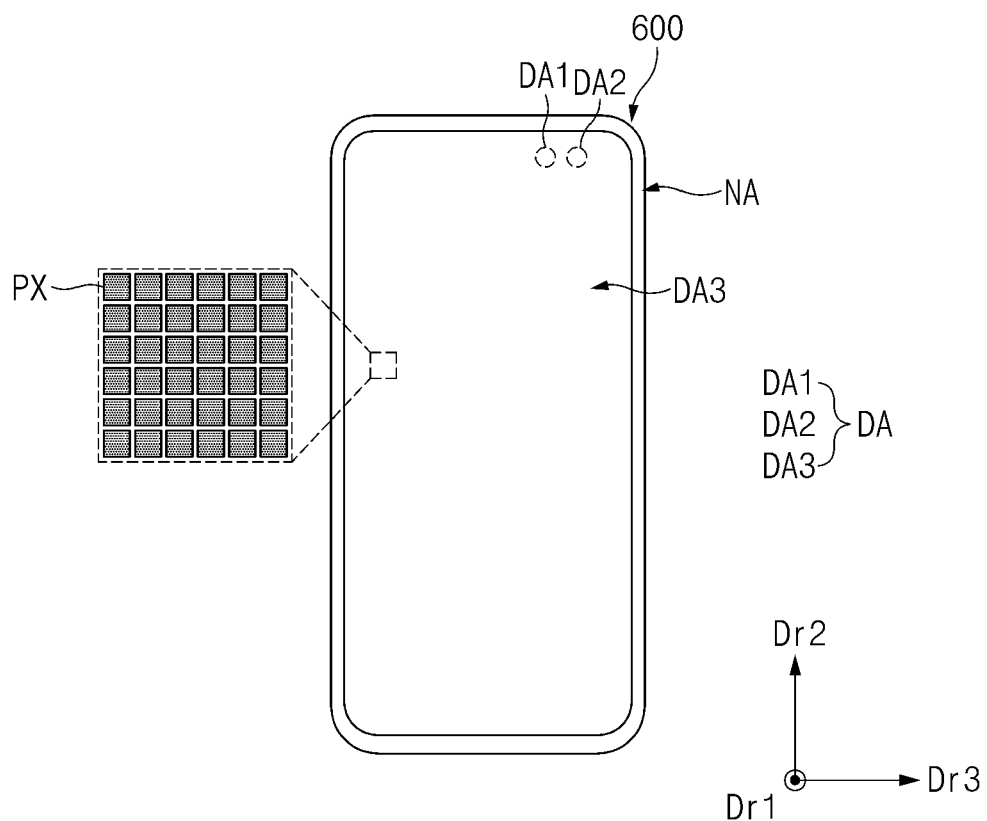
FIG. 6 is a plan view illustrating an example display panel included in an electronic device according to various embodiments

FIG. 6 is a plan view illustrating an example display panel 600 included in an electronic device according to various embodiments. FIG. 7 is a plan view illustrating a first display area DA1 of the display panel 600 in an electronic device according to various embodiments. FIG. 8 is a plan view illustrating a second display area DA2 of the display panel 600 in an electronic device according to various embodiments.

According to an embodiment, the display panel 600 may include a flexible substrate. The electronic device according to an embodiment may include a foldable display, a rollable display, an extendable display, and a deformable display such as a flexible display.

Referring to FIG. 6, the display panel 600 of the electronic device according to an embodiment may include a display area DA in which a plurality of pixels PX are arranged and a non-display area NA in which an image is not displayed. For example, the non-display area NA may surround the display area DA. However, unlike the illustration of FIG. 6, the non-display area NA may not be in contact with at least a portion of an edge of the display area DA.

The display area DA may include a first display area DA1, a second display area DA2, and a third display area DA3. At least a portion of the first display area DA1 of the display panel 600 may overlap the first camera module 305 (see FIG. 3) in the first direction Dr1. The first display area DA1 may be determined by an angle of view of the first camera module 305 and/or a distance between the display panel 600 and the first camera module 305. The first display area DA1 may be a portion of the display area DA through which light that is incident on the first camera module 305 is transmitted. At least a portion of the second display area DA2 of the display panel 600 may overlap the second camera module 306 (see FIG. 3) in the first direction Dr1. The second display area DA2 may be determined by an angle of view of the second camera module 306 and/or a distance between the display panel 600 and the second camera module 306. The second display area DA2 may be a portion of the display area DA through which light that is incident on the second camera module 306 is transmitted.

For example, the first camera module 305 may be a color camera for obtaining a color image. The second camera module 306 may be a black-and-white camera for obtaining a black-and-white image. The first camera module 305 may include various camera circuitry (or, a first camera circuitry) including a first image sensor. The second camera module 306 may include various camera circuitry (or, a second camera circuitry) including a second image sensor. In an embodiment, the first image sensor of the first camera module 305 may include a first color filter that transmits only light of a wavelength range exhibiting a first color, a second color filter that transmits only light of a wavelength range exhibiting a second color, and/or a third color filter that transmits only light of a wavelength range exhibiting a third color. The first image sensor of the first camera module 305 may extract a chromaticity signal divided into three primary colors. For example, the first color may be a red color, the second color may be a green color, and the third color may be a blue color. In an embodiment, the second image sensor of the second camera module 306 may not include a color filter. For example, the second image sensor of the second camera module 306 may extract a luminance signal. According to an embodiment, the electronic device may further include a camera module (not shown). For example, the electronic device according to an embodiment may further include a camera module including various camera circuitry including, for example, a time-of-flight (TOF) sensor.

According to an embodiment, the third display area DA3 may be a portion of the display area DA excluding the first display area DA1 and the second display area DA2. For example, the first display area DA1 and/or the second display area DA2 may be surrounded by the third display area DA3. In the electronic device according to an embodiment, at least one pixel PX may be arranged in the first display area DA1 overlapping the first camera module 305 and the second display area DA2 overlapping the second camera module 306 when viewed in the first direction Dr1.

According to an embodiment, the pixel PX may be a minimum unit for displaying an image. For example, the pixel PX may include at least one of a red sub-pixel (not shown), a green sub-pixel (not shown), or a blue sub-pixel (not shown) to display a color image. For another example, the plurality of pixels PX may include an RGBG pentile structure in which red sub-pixels and blue sub-pixels are alternately arranged on the same column and green sub-pixels are arranged on an adjacent column. However, an embodiment of the present disclosure is not limited thereto, and the plurality of pixels PX may include an RGB stripe structure.

Figure 7:
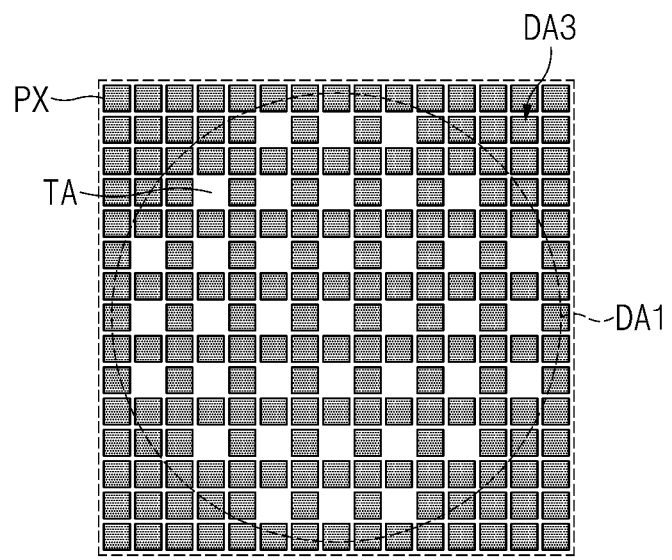
FIG. 7 is a plan view illustrating an example first display area of a display panel in an electronic device according to various embodiments.
Figure 8:
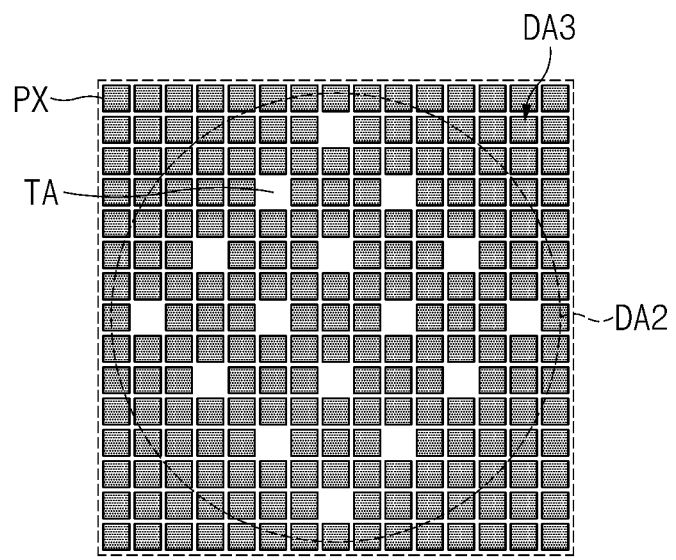
FIG. 8 is a plan view illustrating an example second display area of a display panel in an electronic device according to various embodiments.

Referring to FIGS. 7 and 8, the plurality of pixels PX may be arranged in the first display area DA1, the second display area DA2, and the third display area DA3. According to an embodiment, the first display area DA1 and the second display area DA2 may include at least one transmission area TA in which the pixel PX is removed and light is transmitted. For example, the transmission area TA may be surrounded by the plurality of pixels PX. In an embodiment, one transmission area TA may be substantially the same as or larger than an area occupied by one pixel PX. According to an embodiment, the plurality of pixels PX may have a first pixel density in the first display area DAL The plurality of pixels PX may have a second pixel density in the second display area DA2. The plurality of pixels PX may have a third pixel density in the third display area DA3. For example, the pixel density may refer to pixels per inch (PPI).

Referring to FIGS. 6 7 and 8, the first pixel density, the second pixel density, and the third pixel density may be different from each other. For example, the second pixel density (e.g., 375 PPI) may be greater than the first pixel density (e.g., 250 PPI). For another example, the third pixel density (e.g., 600 PPI) may be greater than the second pixel density (e.g., 375 PPI). In an embodiment, the first display area DA1 and/or the second display area DA2 may have a pixel density determined according to characteristics of a camera module aligned with each of the areas. For example, the first image sensor of the first camera module 305 aligned with the first display area DA1 may include a color filter, and the second image sensor of the second camera module 306 aligned with the second display area DA2 may not include a color filter. For example, in the case where an image sensor includes a color filter, light transmittance may decrease due to the color filter. In the electronic device according to an embodiment, pixels may be arranged so that the pixel density of the first display area DA1 is less than the pixel density of the second display area DA2, thus increasing the light transmittance of the first display area DA1. For example, the first pixel density may be ⅛ of the third pixel density. The second pixel density may be ¼ of the third pixel density.

According to an embodiment, patterns of the sub-pixels arranged in the first display area DA1, the second display area DA2, and the third display area DA3 may be substantially the same. For example, the sub-pixels of the first display area DA1, the second display area DA2, and the third display area DA3 may be arranged in an RGBG pattern. According to an embodiment, the patterns of the sub-pixels arranged in the first display area DA1, the second display area DA2, and the third display area DA3 may be differently formed. For example, the sub-pixels of at least one of the first display area DA1, the second display area DA2, or the third display area DA3 may be arranged in an RGBG pattern, and the sub-pixels of the other areas may be arranged in an RGB pattern. The first display area DA1 may be determined by an angle of view of the first camera module 305 and/or a distance between the display panel 600 and the first camera module 305. The first display area DA1 may be wider than an effective aperture of a lens included in the first camera module 305. The second display area DA2 may be determined by an angle of view of the second camera module 306 and/or a distance between the display panel 600 and the second camera module 306. The second display area DA2 may be wider than an effective aperture of a lens included in the second camera module 306.

Hereinafter, a first light shielding member 810 included in a display panel (e.g., the display panel 600 of FIG. 6) of an electronic device (e.g., the electronic device 300 of FIG. 3) according to an embodiment will be described in greater detail below with reference to FIGS. 9, 10, and 11.

Figure 9:
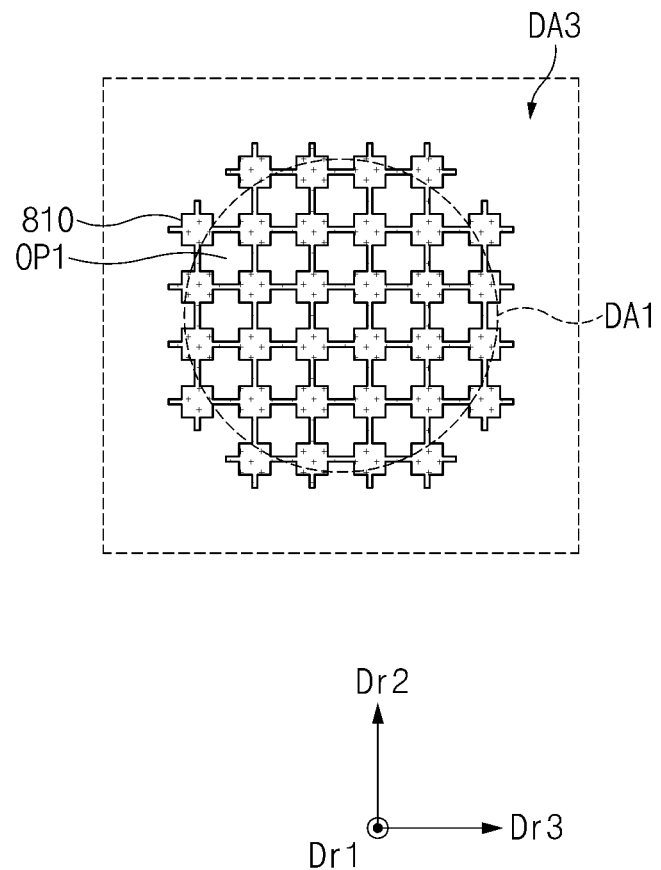
FIG. 9 is a plan view illustrating an example first light shielding member arranged in a first display area in an electronic device according to various embodiments.

FIG. 9 is a plan view illustrating the first light shielding member 810 arranged in the first display area DA1 in an electronic device according to various embodiments. FIG. 10 is an enlarged view illustrating a portion of the first display area DA1 in an electronic device according to various embodiments. FIG. 11 is a cross-sectional view illustrating the first display area DA1 of an electronic device according to various embodiments.

Figure 10:
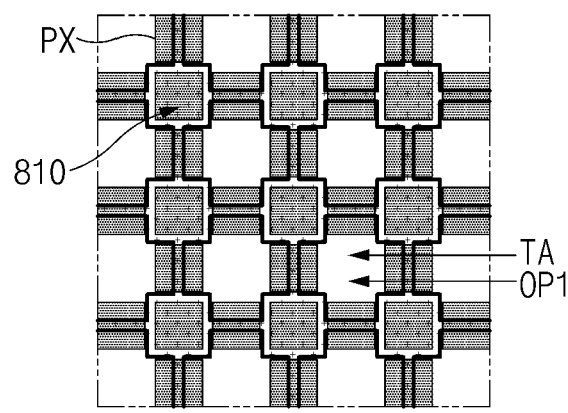
FIG. 10 is an enlarged view illustrating a portion of a first display area in an electronic device according to various embodiments.
Figure 10:
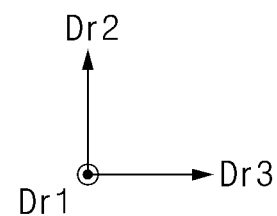

Referring to FIGS. 9 and 10, the display panel 600 of the electronic device according to an embodiment may include the first light shielding member 810 arranged in the first display area DA1. For example, the first light shielding member 810 may include a material that blocks light. The first light shielding member 810 may include a colored (e.g., black) metal layer. For example, the metal layer may include at least one of stainless steel (SUS), aluminum (Al), or aluminum alloy. In an embodiment, the first light shielding member 810 may include a plurality of first openings OP1. For example, the plurality of first openings OP1 of the first light shielding member 810 may have a shape of "+". However, the plurality of first openings OP1 are not limited to this shape, and may have any shapes. For example, the first openings OP1 may be circular or rectangular. For another example, the first openings OP1 may have a linear shape extending in a plurality of directions.

According to an embodiment, the first light shielding member 810 may overlap the plurality of pixels PX in the first direction Dr1. When viewed in the first direction Dr1, at least a portion of the first light shielding member 810 may overlap the first display area DA1 including the plurality of pixels PX. The plurality of first openings OP1 of the first light shielding member 810 may be positioned in the transmission area TA of the first display area DA1. For example, when viewed in the first direction Dr1, at least a portion of the plurality of first openings OP1 of the first light shielding member 810 may overlap at least a portion of the transmission area TA of the first display area DA1. In an embodiment, the first light shielding member 810 may be arranged in an entirety of the first display area DA1 and a periphery of the first display area DA1. In an embodiment, the first light shielding member 810 may be arranged in the first display area DA1 but may not be arranged in the third display area DA3. The pixel PX may include a plurality of lines, a plurality of thin film transistors, and an organic light-emitting diode (OLED). The electronic device according to an embodiment may display an image since the pixels PX are arranged in the first display area DA1. In the electronic device according to an embodiment, the first camera module 305 (see FIG. 3) arranged under the display panel 600 may obtain an image using light transmitted through the display panel 600. The electronic device according to an embodiment may include the first light shielding member 810 that overlaps the pixels PX and blocks light, so as to prevent and/or reduce quality of an obtained image from deteriorating due to refraction or diffraction of light transmitted through the transmission area TA of the display panel 600.

A cross-sectional structure of the first display area DA1 of an electronic device according to an embodiment will be described in greater detail with reference to FIG. 11. Referring to FIG. 11, the electronic device according to an embodiment may include a window 1050, the display panel 600, and/or a first camera module 1060 (e.g., the first camera module 305 of FIG. 3) arranged under the display panel 600. The display panel 600 may include a substrate 1010, the first light shielding member 810, a pixel circuit layer 1020, an organic emission layer 1030, and/or an encapsulation layer 1040.

The substrate 1010 may be arranged on a front surface of the display area DA. For example, the substrate 1010 may be arranged in the first display area DA1 and the third display area DA3. The substrate 1010 may include a transparent material so as to transmit light. For example, the substrate 1010 may include polyethylene terephthalate (PET). For another example, the substrate 1010 may include polyimide (PI) or glass.

The pixel circuit layer 1020 may be arranged on the substrate 1010. The pixel circuit layer 1020 may include lines (not shown) for transferring signals for driving pixels, a plurality of transistors (not shown), and/or an interlayer insulating film (not shown). The pixel circuit layer 1020 may not be arranged in the transmission area TA in the first display area DA1. When viewed in the first direction Dr1, the pixel circuit layer 1020 may not be arranged in a location overlapping the transmission area TA of the first display area DA1. The pixel circuit layer 1020 may be arranged in the third display area DA3 and in the first display area DA1 excluding the transmission area TA. When viewed in the first direction Dr1, the pixel circuit layer 1020 may be arranged in the first display area DA1 not overlapping the transmission area TA of the first display area DA1. However, depending on an embodiment, a partial configuration of the pixel circuit layer 1020 may be arranged in the transmission area TA of the display panel 600.

According to an embodiment, the first light shielding member 810 arranged between the substrate 1010 and the pixel circuit layer 1020 may be positioned in the first display area DA1. For example, the first light shielding member 810 may be floated so as not to be electrically connected to the pixel circuit layer 1020. The first light shielding member 810 may include the plurality of first openings OP1 penetrating the first light shielding member 810 in the first direction Dr1.

The organic emission layer 1030 may be arranged on the pixel circuit layer 1020. For example, the organic emission layer 1030 may include a low molecular weight organic material or a high molecular weight organic material such as poly 3,4-ethylenedioxythiophene (PEDOT). For another example, the organic emission layer 1030 may be a multi-film further including at least one of a hole injection layer (HIL), a hole transporting layer (HTL), an electron transporting layer (ETL), or an electron injection layer (EIL). The organic emission layer 1030 may include a first organic emission layer 1031 for emitting light of a first color, a second organic emission layer 1032 for emitting light of a second color, and/or a third organic emission layer 1033 for emitting light of a third color. The organic emission layer 1030 may not be arranged in the transmission area TA of the first display area DA1. When viewed in the first direction Dr1, the organic emission layer 1030 may not be arranged in a location overlapping the transmission area TA of the first display area DA1. When viewed in the first direction Dr1, the organic emission layer 1030 may be arranged in the first display area DA1 not overlapping the transmission area TA of the first display area DA1. The organic emission layer 1030 may be arranged in the third display area DA3 and in the first display area DA1 excluding the transmission area TA.

The encapsulation layer 1040 may be arranged on the organic emission layer 1030. The encapsulation layer 1040 may cover and seal the pixel circuit layer 1020 and the organic emission layer 1030. For example, since an OLED is vulnerable to moisture and oxygen, the encapsulation layer 1040 may seal the pixel circuit layer 1020 and the organic emission layer 1030 to prevent and/or reduce introduction of external moisture and oxygen. In an embodiment, the encapsulation layer 1040 may include a plurality of layers. For example, the encapsulation layer 1040 may include a composite film including both an inorganic film and an organic film. For another example, the encapsulation layer 1040 may include a triple layer in which an inorganic film, an organic film, and another inorganic film are sequentially arranged.

The window 1050 may be arranged on the encapsulation layer 1040. The window 1050 may be transparent and may transmit light. For example, the window 1050 may include tempered glass, reinforced plastic, or flexible polymer material. The window 1050 may be attached to the display panel 600 using a transparent adhesive layer (not shown). Depending on an embodiment, the window 1050 may include a plurality of layers. The electronic device according to an embodiment may further include a coating layer (or protective layer) arranged on one surface of the window 1050. Depending on an embodiment, the display panel 600 may further include a color filter layer (e.g., the color filter layer 1070 of FIG. 15) arranged on the encapsulation layer 1040.

The first camera module 1060 (e.g., the first camera module 305 of FIG. 3) may be arranged under the display panel 600. When viewed in the first direction Dr1 (or when viewed from above the display panel 600), the first camera module 1060 may overlap the first display area DA1 of the display panel 600. The first camera module 1060 may obtain an image using light transmitted through the first display area DA1 of the display panel 600. In an embodiment, the first camera module 1060 may be a color camera for obtaining a color image. For example, the first camera module 1060 may include a first image sensor, which may include a color filter.

Hereinafter, a second light shielding member 820 included in a display panel (e.g., the display panel 600 of FIG. 6) of an electronic device according to an embodiment will be described in greater detail below with reference to FIGS. 12, 13, and 14.

Figure 12:
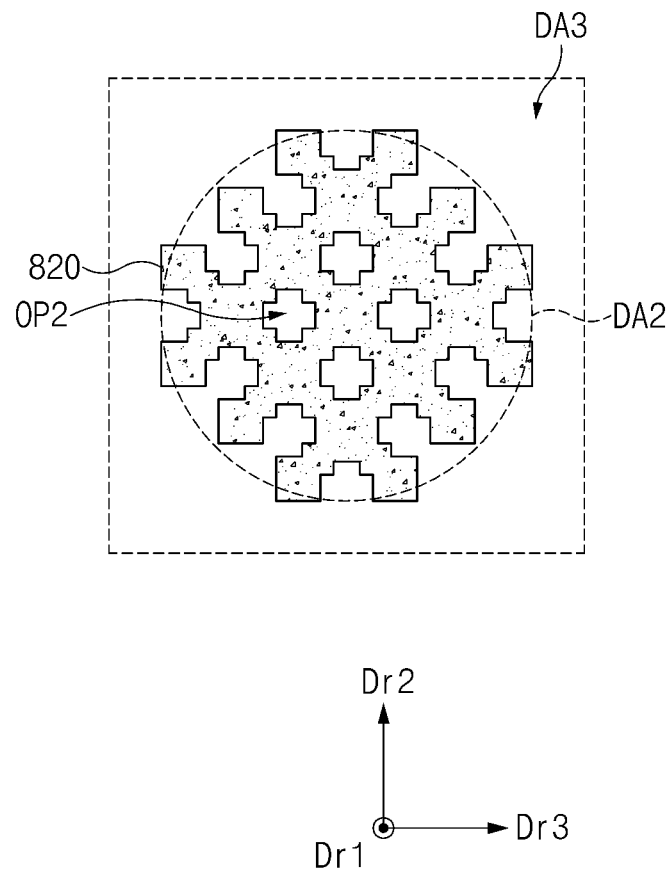
FIG. 12 is a plan view illustrating an example second light shielding member arranged in a second display area in an electronic device according to various embodiments.

FIG. 12 is a plan view illustrating the second light shielding member 820 arranged in the second display area DA2 in an electronic device according to various embodiments.

Figure 13:
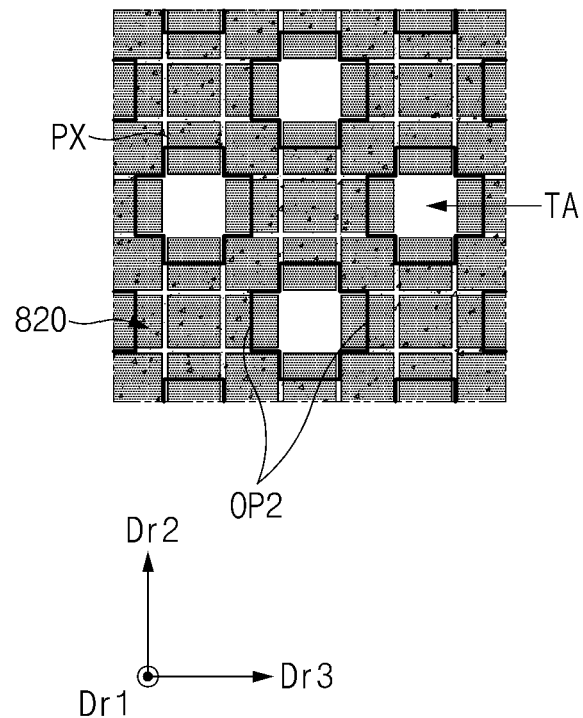
FIG. 13 is an enlarged view illustrating a portion of a second display area in an electronic device according to various embodiments.

FIG. 13 is an enlarged view illustrating a portion of the second display area DA2 in an electronic device according to various embodiments. FIG. 14 is a cross-sectional view illustrating the second display area DA2 of an electronic device according to various embodiments.

Referring to FIGS. 12 and 13, the display panel 600 of the electronic device according to an embodiment may include the second light shielding member 820 arranged in the second display area DA2. For example, the second light shielding member 820 may include a material that blocks light. The second light shielding member 820 may include a colored (e.g., black) metal layer. For example, the metal layer may include at least one of stainless steel (SUS), aluminum (Al), or aluminum alloy. The second light shielding member 820 may include a plurality of second openings OP2. For example, the plurality of second openings OP2 of the second light shielding member 820 may have a shape of "+". However, the plurality of second openings OP2 are not limited to this shape, and may have any shapes. For example, the second openings OP2 may be circular or rectangular. For another example, the second openings OP2 may have a linear shape extending in a plurality of directions.

According to an embodiment, the second light shielding member 820 may overlap the plurality of pixels PX in the first direction Dr1. When viewed in the first direction Dr1, at least a portion of the second light shielding member 820 may overlap the second display area DA2 including the plurality of pixels PX. At least a portion of the plurality of second openings OP2 of the second light shielding member 820 may be positioned in the transmission area TA of the second display area DA2. For example, when viewed in the first direction Dr1, at least a portion of the plurality of second openings OP2 of the second light shielding member 820 may overlap at least a portion of the transmission area TA of the second display area DA2. In an embodiment, the second light shielding member 820 may be arranged in an entirety of the second display area DA2 and a periphery of the second display area DA2. In an embodiment, the second light shielding member 820 may be arranged in the second display area DA2 but may not be arranged in the third display area DA3. The pixel PX may include a plurality of lines, a plurality of thin film transistors, and an organic light-emitting diode (OLED). The electronic device according to an embodiment may display an image since the pixels PX are arranged in the second display area DA2. The second camera module 306 arranged under the display panel 600 may obtain an image using light transmitted through the display panel 600. The electronic device according to an embodiment may include the second light shielding member 820 that overlaps the pixels PX and blocks light, so as to prevent and/or reduce quality of an obtained image from deteriorating due to refraction or diffraction of light transmitted through the second openings OP2 of the display panel 600.

A cross-sectional structure of the second display area DA2 of an electronic device according to an embodiment will be described with reference to FIG. 14. Referring to FIG. 14, the electronic device according to an embodiment may include the window 1050, the display panel 600, and/or a second camera module 1360 (e.g., the second camera module 306 of FIG. 3) arranged under the display panel 600. The display panel 600 may include the substrate 1010, the second light shielding member 820, the pixel circuit layer 1020, the organic emission layer 1030, and/or the encapsulation layer 1040. Hereinafter, detailed descriptions of configurations overlapping with those of FIG. 11 will not be provided.

The substrate 1010 may be arranged on a front surface of the display area DA. For example, the substrate 1010 may be arranged in the second display area DA2 and the third display area DA3. The substrate 1010 may include a transparent material so as to transmit light. For example, the substrate 1010 may include polyethylene terephthalate (PET). For another example, the substrate 1010 may include polyimide (PI) or glass.

The pixel circuit layer 1020 may be arranged on the substrate 1010. The pixel circuit layer 1020 may include lines (not shown) for transferring signals for driving pixels, a plurality of transistors (not shown), and/or an interlayer insulating film (not shown). The pixel circuit layer 1020 may not be arranged in the transmission area TA in the second display area DA2. When viewed in the first direction Dr1, the pixel circuit layer 1020 may not be arranged in a location overlapping the transmission area TA of the second display area DA2. The pixel circuit layer 1020 may be arranged in the third display area DA3 and in the second display area DA2 excluding the transmission area TA. When viewed in the first direction Dr1, the pixel circuit layer 1020 may be arranged in the second display area DA2 not overlapping the transmission area TA of the second display area DA2. However, depending on an embodiment, a partial configuration of the pixel circuit layer 1020 may be arranged in the transmission area TA of the display panel 600.

According to an embodiment, the second light shielding member 820 arranged between the substrate 1010 and the pixel circuit layer 1020 may be positioned in the second display area DA2. For example, the second light shielding member 820 may be floated so as not to be electrically connected to the pixel circuit layer 1020. The second light shielding member 820 may include the plurality of second openings OP2 penetrating the second light shielding member 820 in the first direction Dr1.

The organic emission layer 1030 may be arranged on the pixel circuit layer 1020. For example, the organic emission layer 1030 may include the first organic emission layer 1031 for emitting light of a first color, the second organic emission layer 1032 for emitting light of a second color, and/or the third organic emission layer 1033 for emitting light of a third color. The organic emission layer 1030 may not be arranged in the transmission area TA of the second display area DA2. The organic emission layer 1030 may be arranged in the third display area DA3 and in the second display area DA2 excluding the transmission area TA.

The encapsulation layer 1040 may be arranged on the organic emission layer 1030. The encapsulation layer 1040 may cover and seal the pixel circuit layer 1020 and the organic emission layer 1030.

The window 1050 may be arranged on the encapsulation layer 1040. The window 1050 may include a transparent material and may transmit light. Depending on an embodiment, the display panel 600 may further include a color filter layer (e.g., the color filter layer 1070 of FIG. 15) arranged on the encapsulation layer 1040.

The second camera module 1360 (e.g., the second camera module 306 of FIG. 3) may be arranged under the display panel 600. When viewed in the first direction Dr1, the second camera module 1360 may overlap the second display area DA2 of the display panel 600. The second camera module 1360 may obtain an image using light transmitted through the second display area DA2 of the display panel 600. In an embodiment, the second camera module 1360 may be a black-and-white camera for obtaining a black-and-white image. For example, the second camera module 1360 may include a second image sensor, which may not include a color filter.

Figure 11:
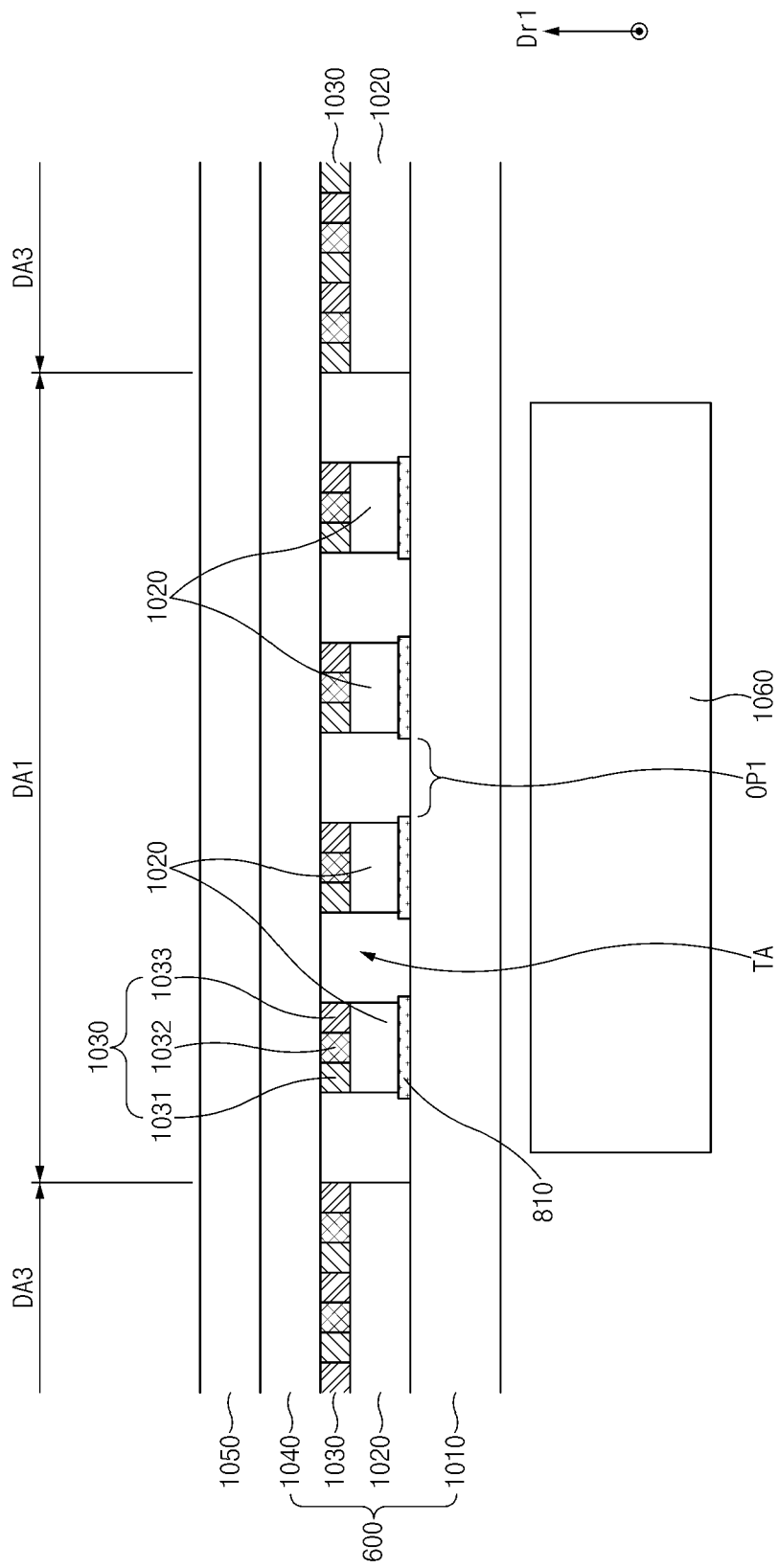
FIG. 11 is a cross-sectional view illustrating a first display area of an electronic device according to various embodiments.
Figure 14:
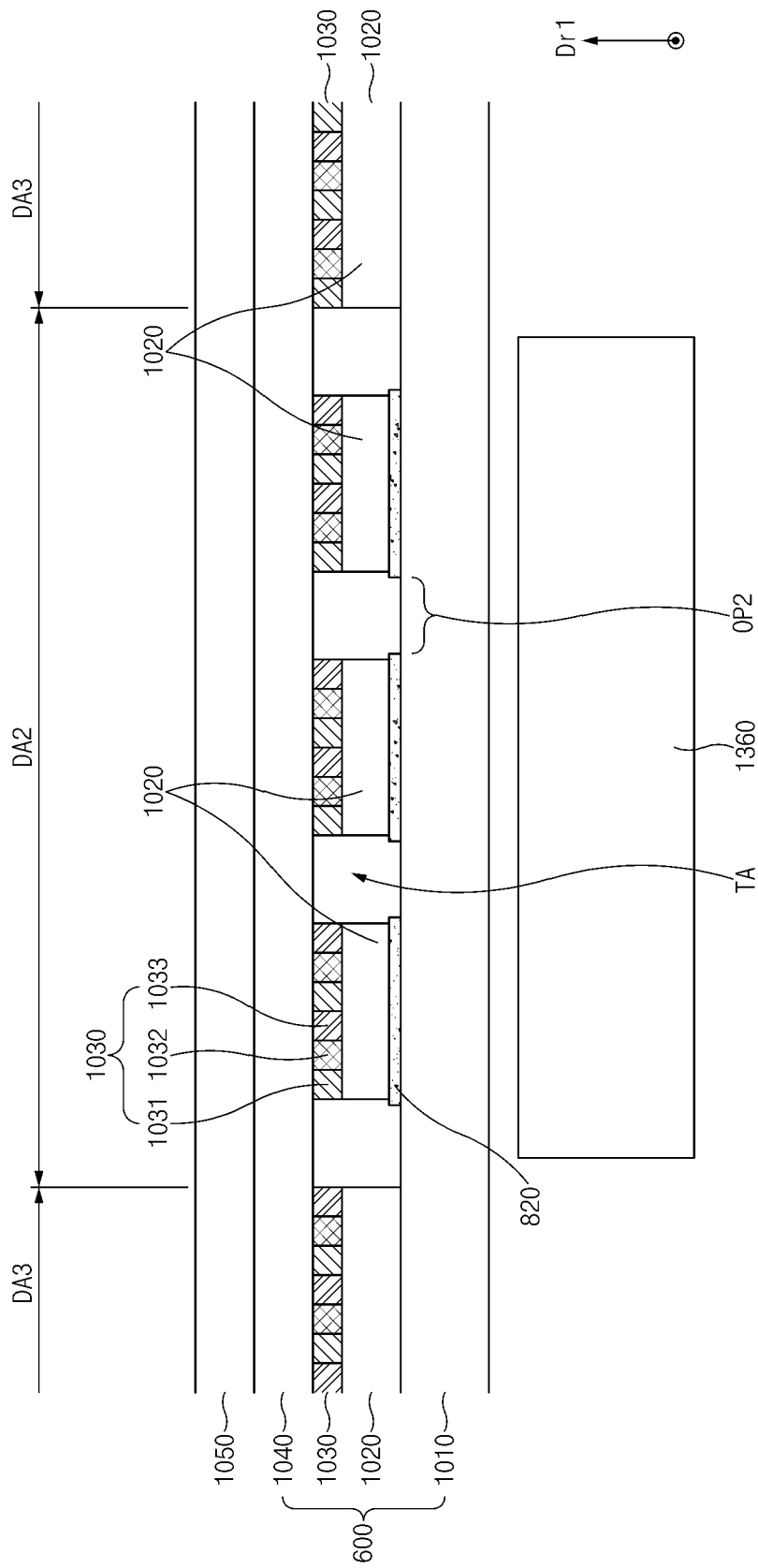
FIG. 14 is a cross-sectional view illustrating a second display area of an electronic device according to various embodiments.

Referring to FIGS. 11 and 14, the first light shielding member 810 and the second light shielding member 820 may be arranged in the same layer. In an embodiment, the first light shielding member 810 and the second light shielding member 820 may include the same material. In an embodiment, the first light shielding member 810 and the second light shielding member 820 may be spaced apart without being connected to each other. The first opening OP1 of the first light shielding member 810 and the second opening OP2 of the second light shielding member 820 may have the same shape. The first opening OP1 may have a larger area than that of the second opening OP2. Unlike the illustration, the first opening OP1 of the first light shielding member 810 and the second opening OP2 of the second light shielding member 820 may have different shapes. In an embodiment, within areas of the same size in the display panel 600, a size of an area of the first light shielding member 810 excluding the first openings OP1 may be smaller than a size of an area of the second light shielding member 820 excluding the second openings OP2. Within areas of the same size in the display panel 600, a total area of the first openings OP1 may be larger than a total area of the second openings OP2.

A cross-sectional structure of the third display area DA3 of an electronic device according to an embodiment will be described with reference to FIG. 15.

Figure 15:
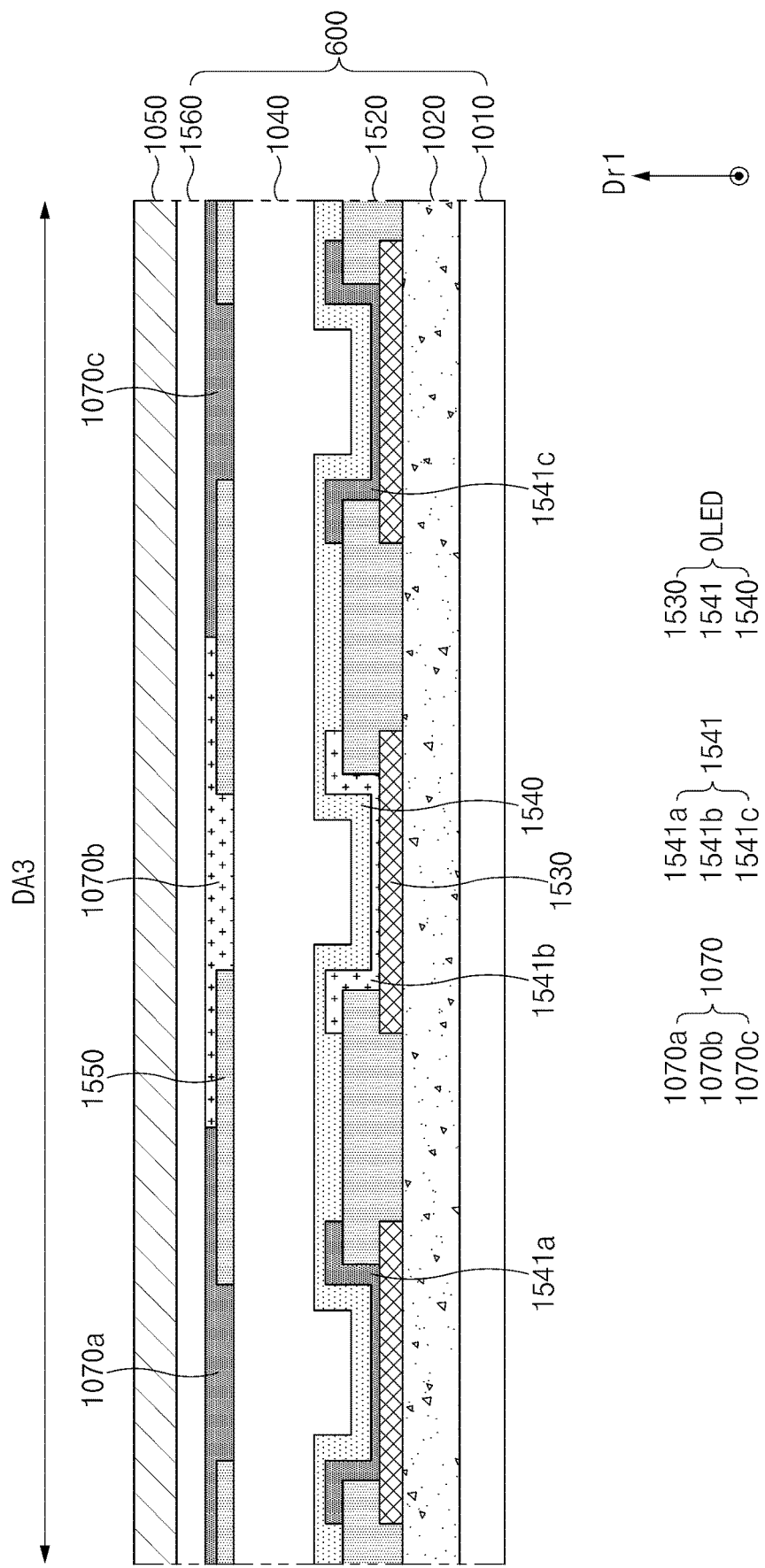
FIG. 15 is a cross-sectional view illustrating a third display area of an electronic device according to various embodiments.

FIG. 15 is a cross-sectional view illustrating the third display area DA3 of an electronic device according to an embodiment.

The electronic device according to an embodiment may include the display panel 600 and/or the window 1050. The display panel 600 may include the substrate 1010, the pixel circuit layer 1020, an organic light-emitting diode (OLED), a pixel defining film 1520, the encapsulation layer 1040, a third light shielding member 1550, a color filter layer 1070, and/or an adhesive layer 1560. Hereinafter, detailed descriptions of configurations overlapping with those of FIG. 11 will not be provided.

The pixel circuit layer 1020 may be arranged on the substrate 1010. The pixel circuit layer 1020 may include at least one transistor to supply a current for driving a pixel to a pixel electrode 1530 of the OLED.

The pixel electrode 1530 may be arranged on the pixel circuit layer 1020.

The pixel defining film 1520 may be arranged on the pixel circuit layer 1020 and the pixel electrode 1530. The pixel defining film 1520 may include a pixel opening that exposes the pixel electrode 1530. Depending on an embodiment, the pixel defining film 1520 may include a light blocking material. In the case where the pixel defining film 1520 includes a light blocking material, color mixing between light generated by one organic emission layer 1541 and light generated by another organic emission layer 1541 of an adjacent pixel may be prevented and/or reduced.

The organic emission layer 1541 and a common electrode 1540 may be arranged on the pixel electrode 1530 exposed by the pixel opening. The common electrode 1540 may also be formed on the pixel defining film 1520 so as to be arranged over a plurality of pixels PX. The pixel electrode 1530, the organic emission layer 1541, and the common electrode 1540 may form the OLED.

The pixel electrode 1530 may be an anode that may include a hole injection electrode, and the common electrode 1540 may be a cathode that is an electron injection electrode. Holes and electrons may be respectively injected from the pixel electrode 1530 and the common electrode 1540 into the organic emission layer 1541, and light may be emitted when excitons in which the injected holes and electrons are combined transition from an excitation state to a ground state.

The organic emission layer 1541 may include a first organic emission layer 1541a for emitting light of a first color, a second organic emission layer 1541b for emitting light of a second color, and a third organic emission layer 1541c for emitting light of a third color.

The encapsulation layer 1040 that seals the OLED may be arranged on the common electrode layer 1540.

The third light shielding member 1550 may be arranged on the encapsulation layer 1040. The third light shielding member 1550 may include a plurality of openings in areas overlapping the first organic emission layer 1541a, the second organic emission layer 1541b, and the third organic emission layer 1541c.

The color filter layer 1070 may be arranged in the openings of the third light shielding member 1550. The color filter layer 1070 may transmit light of a specified wavelength range. The color filter layer 1070 may include a first color filter 1070a, a second color filter 1070b, and a third color filter 1070c. The first color filter 1070a may transmit light of a wavelength range exhibiting a first color. The second color filter 1070b may transmit light of a wavelength range exhibiting a second color. The third color filter 1070c may transmit light of a wavelength range exhibiting a third color. The color filter layer 1070 may overlap the OLED. The first color filter 1070a, the second color filter 1070b, and the third color filter 1070c of the color filter layer 1070 may respectively overlap the first organic emission layer 1541a, the second organic emission layer 1541b, and the third organic emission layer 1541c. The adhesive layer 1560 and the window 1050 may be arranged on the color filter layer 1070.

Hereinafter, an electronic device 1600 according to an embodiment will be described with reference to FIG. 16.

Figure 16:
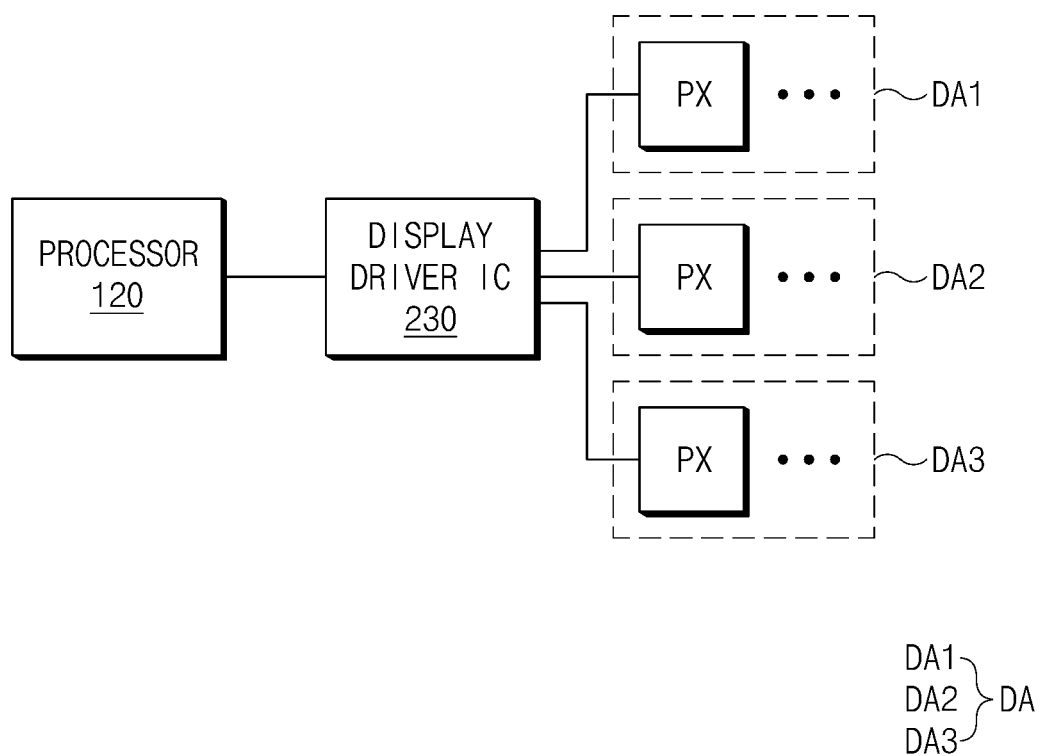
FIG. 16 is a block diagram illustrating an example electronic device according to various embodiments.

FIG. 16 is a block diagram illustrating an example electronic device 1600 according to various embodiments. Referring to FIG. 16, the electronic device 1600 according to an embodiment may include a processor (e.g., including processing circuitry) 120 (e.g., an application processor (AP)), a display driver IC 230, and/or a plurality of pixels PX.

The processor 120 may include various processing circuitry and control overall operation of the electronic device 1600. According to an embodiment, the processor 120 may include, for example, and without limitation, an integrated circuit, a system on chip, a central processing unit (CPU), dedicated processor, a mobile AP, or the like. The processor 120 may transfer, to the display driver IC 230, a signal related to data to be displayed (e.g., display data such as image data, video data, or still image data). The processor 120 may control signals supplied to the plurality of pixels PX arranged in the first display area DA1, the second display area DA2, and/or the third display area DA3 of the display panel 600.

The display driver IC 230 may be electrically connected to the processor 120. The display driver IC 230 may include various circuitry and convert data transmitted from the processor 120 into a format transmittable to the plurality of pixels PX arranged in the first display area DA1, the second display area DA2, and/or the third display area DA3, and may transmit the converted data to the plurality of pixels PX. The display driver IC 230 may process pieces of display data on a pixel-by-pixel basis according to locations of the pixels PX in the display area DA. The display driver IC 230 may supply a driving signal that is based on the display data to the plurality of pixels PX.

The display area DA may display an image based on the display data received from the display driver IC 230 through the plurality of pixels PX. In an embodiment, the display area DA may include the first display area DA1, the second display area DA2, and/or the third display area DA3. For example, the first display area DA1 may overlap the first camera module 1060 (see FIG. 11). The second display area DA2 may overlap the second camera module 1360 (see FIG. 14). For another example, the first display area DA1 may be positioned within a range of an angle of view of the first camera module 1060 in the display area DA. The second display area DA2 may be positioned within a range of an angle of view of the second camera module 1360 in the display area DA. For another example, the first display area DA1 may be a portion of the display area DA through which light that is incident on the first camera module 1060 is transmitted. The second display area DA2 may be a portion of the display area DA through which light that is incident on the second camera module 1360 is transmitted. The third display area DA3 may be a portion of the display area DA excluding the first display area DA1 and the second display area DA2. In an embodiment, the pixel density of the first display area DA1 may be less than the pixel density of the second display area DA2. For another example, the pixel density of the second display area DA2 may be less than the pixel density of the third display area DA3.

According to an embodiment, in relation to display data of content output to the first display area DA1, the second display area DA2, and the third display area DA2, the processor 120 may control the electronic device so that screens are displayed in the first display area DA1 and the second display area DA2 having low pixel densities in substantially the same manner as the third display area DA3. For example, when content (or image or object) of substantially the same color and luminance is required to be displayed over the first display area DA1, the second display area DA2, and the third display area DA3, the electronic device according to an embodiment may set brightness of the pixels PX of the second display area DA2 greater than the brightness of the pixels PX of the third display area DA3, and may set the brightness of the pixels PX of the first display area DA1 greater than the brightness of the pixels PX of the second display area DA2. For example, the processor 120 may convert display data so that the pixels PX of the second display area DA2 are brighter than the pixels PX of the third display area DA3, and the pixels PX of the first display area DA1 are brighter than the pixels PX of the second display area DA2. The processor 120 may transfer the converted display data to the display driver IC 230. The electronic device according to an embodiment may set the brightness of the pixels PX arranged in the display area DA having a low pixel density high so that an entire area of the display area DA viewed by a user may have uniform brightness.

For another example, the display driver IC 230 may use display data received from the processor 120 to convert the display data so that the pixels PX of the second display area DA2 are brighter than the pixels PX of the third display area DA3, and the pixels PX of the first display area DA1 are brighter than the pixels PX of the second display area DA2. The display driver IC 230 may supply the pixels PX of the second display area DA2 with a signal configured to emit brighter light than the pixels PX of the third display area DA3, and may supply the pixels PX of the first display area DA1 with a signal configured to emit brighter light than the pixels PX of the second display area DA2. Therefore, the brightness of an image displayed in the first display area DA1 and the second display area DA2 having lower pixel densities than the pixel density of the third display area DA3 may be substantially the same as the brightness of an image displayed in the third display area DA3.

Hereinafter, a display panel 1700 included in an electronic device (e.g., the electronic device 300 of FIG. 3) according to an embodiment will be described in greater detail below with reference to FIGS. 17 and 18.

Figure 17:
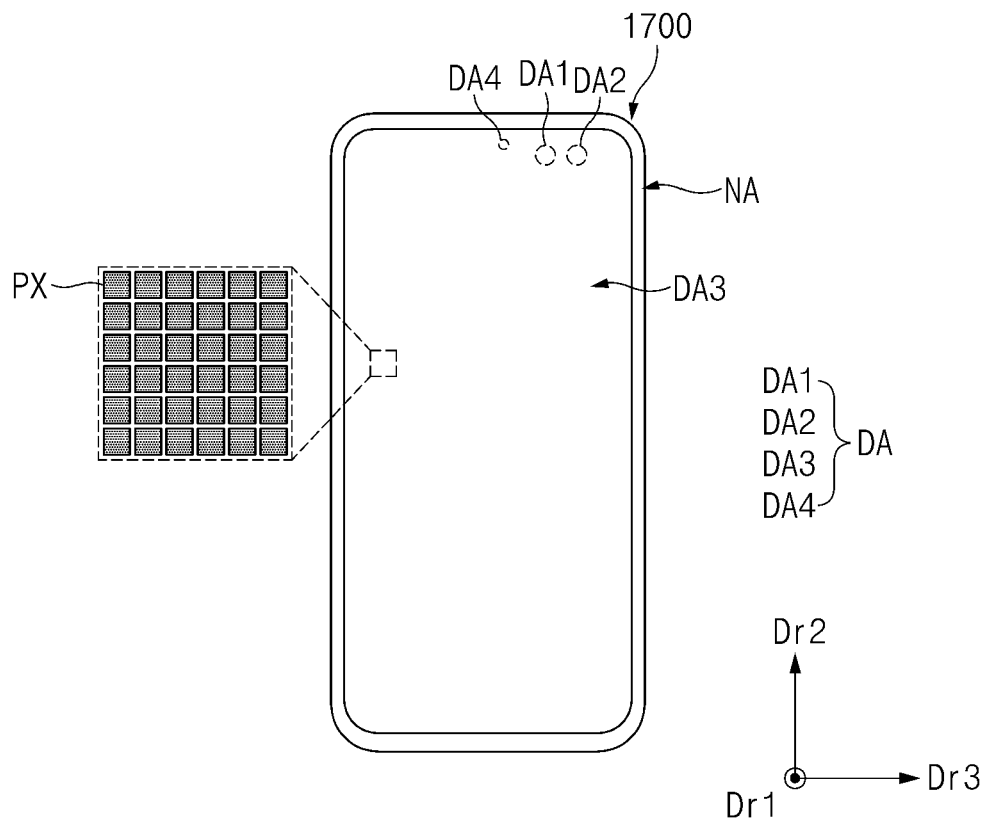
FIG. 17 is a plan view illustrating an example display panel included in an electronic device according to various embodiments.

FIG. 17 is a plan view illustrating the display panel 1700 included in an electronic device according to various embodiments. FIG. 18 is a plan view illustrating a fourth display area DA4 of the display panel 1700 in an electronic device according to various embodiments. For example, FIG. 18 illustrates arrangement of pixels PX in the fourth display area DA4 of the display panel 1700. Hereinafter, detailed descriptions of configurations overlapping with those of FIGS. 6 and 7 may not be repeated. The descriptions provided above with reference to FIGS. 6, 7, and 8 may be referenced in relation to the first display area DA1, the second display area DA2, and the third display area DA3.

Referring to FIG. 17, according to an embodiment, the display panel 1700 of the electronic device may include a display area DA and/or a non-display area NA. For example, a plurality of pixels PX may be arranged in the display area DA. For another example, a driving unit and/or lines for transferring signals to the plurality of pixels PX may be arranged in the non-display area NA.

According to an embodiment, the display area DA may include the first display area DA1, the second display area DA2, the third display area DA3, and/or the fourth display area DA4. The first display area DA1 of the display panel 1700 may overlap the first camera module 305 (see FIG. 3) in the first direction Dr1. The second display area DA2 of the display panel 1700 may overlap the second camera module 306 (see FIG. 3) in the first direction Dr1. The fourth display area DA4 of the display panel 1700 may overlap the sensor module 304 (see FIG. 3) (e.g., an illumination sensor) in the first direction Dr1. For example, the first display area DA1 may be a portion of the display area DA through which light that is incident on the first camera module 305 is transmitted. The second display area DA2 may be a portion of the display area DA through which light that is incident on the second camera module 306 is transmitted. The fourth display area DA4 may be a portion of the display area DA through which light that is incident on the sensor module 304 is transmitted.

For example, the first camera module 305 may be a color camera for obtaining a color image, and the second camera module 306 may be a black-and-white camera for obtaining a black-and-white image. The first camera module 305 may include a first image sensor, and the second camera module 306 may include a second image sensor. For example, the first image sensor of the first camera module 305 may include a first color filter that transmits only light of a wavelength range exhibiting a first color, a second color filter that transmits only light of a wavelength range exhibiting a second color, and/or a third color filter that transmits only light of a wavelength range exhibiting a third color. For another example, the second image sensor of the second camera module 306 may not include a color filter. For example, the sensor module 304 may be an illumination sensor for detecting illumination information including an illumination value.

According to an embodiment, the third display area DA3 may be a portion of the display area DA excluding the first display area DA1, the second display area DA2, and the fourth display area DA4. The first display area DA1, the second display area DA2, and/or the fourth display area DA4 may be surrounded by the third display area DA3. The electronic device according to an embodiment may display an image since the plurality of pixels PX are arranged in the first display area DA1 overlapping the first camera module 305, the second display area DA2 overlapping the second camera module 306, and the fourth display area DA4 overlapping the sensor module 304.

Figure 18:
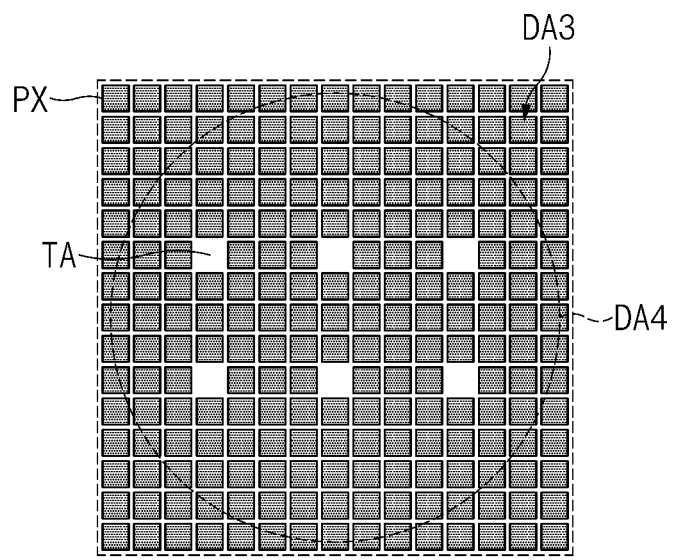
FIG. 18 is a plan view illustrating a fourth display area of a display panel in an electronic device according to various embodiments.

Referring to FIGS. 17 and 18, the plurality of pixels PX may be arranged in the first display area DA1, the second display area DA2, the third display area DA3, and the fourth display area DA4. According to an embodiment, the fourth display area DA4 may include at least one transmission area TA in which the pixel PX is removed and light is transmitted. For example, the transmission area TA may be surrounded by the plurality of pixels PX. One transmission area TA may be substantially the same as or larger than an area occupied by one pixel PX.

The plurality of pixels PX may have a first pixel density in the first display area DAL The plurality of pixels PX may have a second pixel density in the second display area DA2. The plurality of pixels PX may have a third pixel density in the third display area DA3. The plurality of pixels PX may have a fourth pixel density in the fourth display area DA4. For example, the pixel density may refer to pixels per inch (PPI).

Referring to FIGS. 7, 8, and 18, the first pixel density, the second pixel density, and the third pixel density may be different from each other. For example, the second pixel density may be greater than the first pixel density. The fourth pixel density may be greater than the second pixel density. The third pixel density may be greater than the fourth pixel density. According to an embodiment, the fourth pixel density may be 31/32 of the third pixel density. According to an embodiment, the second pixel density may be ¼ of the third pixel density. According to an embodiment, the first pixel density may be ⅛ of the third pixel density. The electronic device according to an embodiment may control the pixels PX of the display area DA so that a quantity of light emitted from one pixel PX of the fourth display area DA4 is larger than a quantity of light emitted from one pixel PX of the third display area DA3. A luminance of one pixel PX of the fourth display area DA4 may be greater than a luminance of one pixel PX of the third display area DA3. The electronic device according to an embodiment may control the pixels PX of the display area DA so that a quantity of light emitted from one pixel PX of the second display area DA2 is larger than a quantity of light emitted from one pixel PX of the fourth display area DA4. The luminance of one pixel PX of the second display area DA2 may be greater than the luminance of one pixel PX of the fourth display area DA4. The electronic device according to an embodiment may control the pixels PX of the display area DA so that the quantity of light emitted from one pixel PX of the first display area DA1 is larger than the quantity of light emitted from one pixel PX of the second display area DA2. A luminance of one pixel PX of the first display area DA1 may be greater than a luminance of one pixel PX of the second display area DA2. The electronic device according to an embodiment may adjust the brightness of the pixels PX according to the pixel density of the display area DA so that externally viewed brightness of the first display area DA1, the second display area DA2, the third display area DA3, and the fourth display area DA4 viewed by a user may be uniform. For example, the processor 120 (see FIG. 16) may convert display data so that the pixels PX of the fourth display area DA4 are brighter than the pixels PX of the third display area DA3, the pixels PX of the second display area DA2 are brighter than the pixels PX of the fourth display area DA4, and the pixels PX of the first display area DA1 are brighter than the pixels PX of the second display area DA2. The processor 120 may transfer the converted display data to the display driver IC 230. For another example, the display driver IC 230 (see FIG. 16) may supply the pixels PX of the fourth display area DA4 with a signal configured to emit brighter light than the pixels PX of the third display area DA3, may supply the pixels PX of the second display area DA2 with a signal configured to emit brighter light than the pixels PX of the fourth display area DA4, and may supply the pixels PX of the first display area DA1 with a signal configured to emit brighter light than the pixels PX of the second display area DA2.

According to an embodiment, patterns of the sub-pixels arranged in the first display area DA1, the second display area DA2, the third display area DA3, and the fourth display area DA4 may be substantially the same. According to an embodiment, the patterns of the sub-pixels arranged in the first display area DA1, the second display area DA2, the third display area DA3, and the fourth display area DA4 may be differently formed.

According to an example embodiment, an electronic device (e.g., the electronic device 300 of FIG. 3) may include: a display panel including the display area (DA) in which a plurality of pixels are arranged and configured to display image in a first direction; and a first camera module including camera circuitry and a second camera module including camera circuitry arranged under the display panel, wherein the display area DA may include a first display area (e.g., DA1) overlapping the first camera module in the first direction (e.g., Dr1) and a second display area (e.g., DA2) overlapping the second camera module in the first direction, and pixels per inch (PPI) of the first display area may be less than PPI of the second display area.

According to an example embodiment, the display panel may further include a first light shielding member comprising a light shielding material arranged in the first display area, wherein the first light shielding member may include the plurality of first openings.

According to an example embodiment, the display panel may further include a second light shielding member comprising a light shielding material arranged in the second display area, wherein the second light shielding member may include the plurality of second openings.

According to an example embodiment, a shape of the plurality of first openings may be different from a shape of the plurality of second openings.

According to an example embodiment, the first display area and the second display area may include a transmission area (e.g., TA) in which the pixels are not arranged, and the plurality of first openings of the first light shielding member and the plurality of second openings of the second light shielding member may be arranged in the transmission area.

According to an example embodiment, the display panel may further include a substrate and a pixel circuit layer arranged on the substrate, and the first light shielding member and the second light shielding member may be arranged between the substrate and the pixel circuit layer.

According to an example embodiment, the first light shielding member and the second light shielding member may not be electrically connected to the pixel circuit layer.

According to an example embodiment, the electronic device may further include a display driver IC electrically connected to the display panel, and the display area may further include the third display area surrounding the first display area and the second display area, wherein the display driver IC may be configured to supply pixels of the second display area with a signal configured to emit brighter light than pixels of the third display area, and supply pixels of the first display area with a signal configured to emit brighter light than the pixels of the second display area.

According to an example embodiment, the electronic device may further include an illumination sensor arranged under the display panel, and the display area may further include the third display area surrounding the first display area and the second display area and may include a fourth display area overlapping the illumination sensor in the first direction, wherein the PPI of the fourth display area may be greater than the PPI of the second display area DA2 and less than the PPI of the third display area.

According to an example embodiment, the electronic device may further include the display driver IC electrically connected to the display panel, wherein the display driver IC may be configured to supply pixels of the fourth display area with a signal configured to emit brighter light than pixels of the third display area, supply pixels of the second display area with a signal configured to emit brighter light than the pixels of the fourth display area, and supply pixels of the first display area with a signal configured to emit brighter light than the pixels of the second display area.

According to an example embodiment, the display area may further include the third display area surrounding the first display area and the second display area, wherein the PPI of the second display area DA2 may be less than the PPI of the third display area.

According to an example embodiment, the first camera module may be a color camera configured to obtain a color image, and the second camera module may be a black-and-white camera configured to obtain a black-and-white image.

According to an example embodiment, an electronic device may include: a display panel including a display area in which a plurality of pixels are arranged and configured to display an image in the first direction; a display driver IC electrically connected to the display panel; a processor electrically connected to the display driver IC; and a first camera module including camera circuitry and a second camera module including camera circuitry arranged under the display panel and configured to obtain an image using light transmitted through the display panel, wherein the display area may include the first display area overlapping the first camera module in the first direction and the second display area overlapping the second camera module in the first direction, pixels per inch (PPI) of the first display area may be less than PPI of the second display area, and the processor may be configured to control the electronic device to obtain an image using at least one of the first camera module or the second camera module.

According to an example embodiment, the display panel may further include a first light shielding member comprising a light shielding material arranged in the first display area, wherein the first light shielding member may include a plurality of first openings.

According to an example embodiment, the display panel may further include a second light shielding member comprising a light shielding material arranged in the second display area, wherein the second light shielding member may include a plurality of second openings.

According to an example embodiment, the first display area and the second display area may include a transmission area in which pixels are not arranged, and the plurality of first openings of the first light shielding member and the plurality of second openings of the second light shielding member may be arranged in the transmission area.

According to an example embodiment, the first light shielding member and the second light shielding member may be spaced apart.

Hereinafter, example operation of an electronic device according to an embodiment will be described in greater detail below with reference to FIG. 19.

Figure 19:
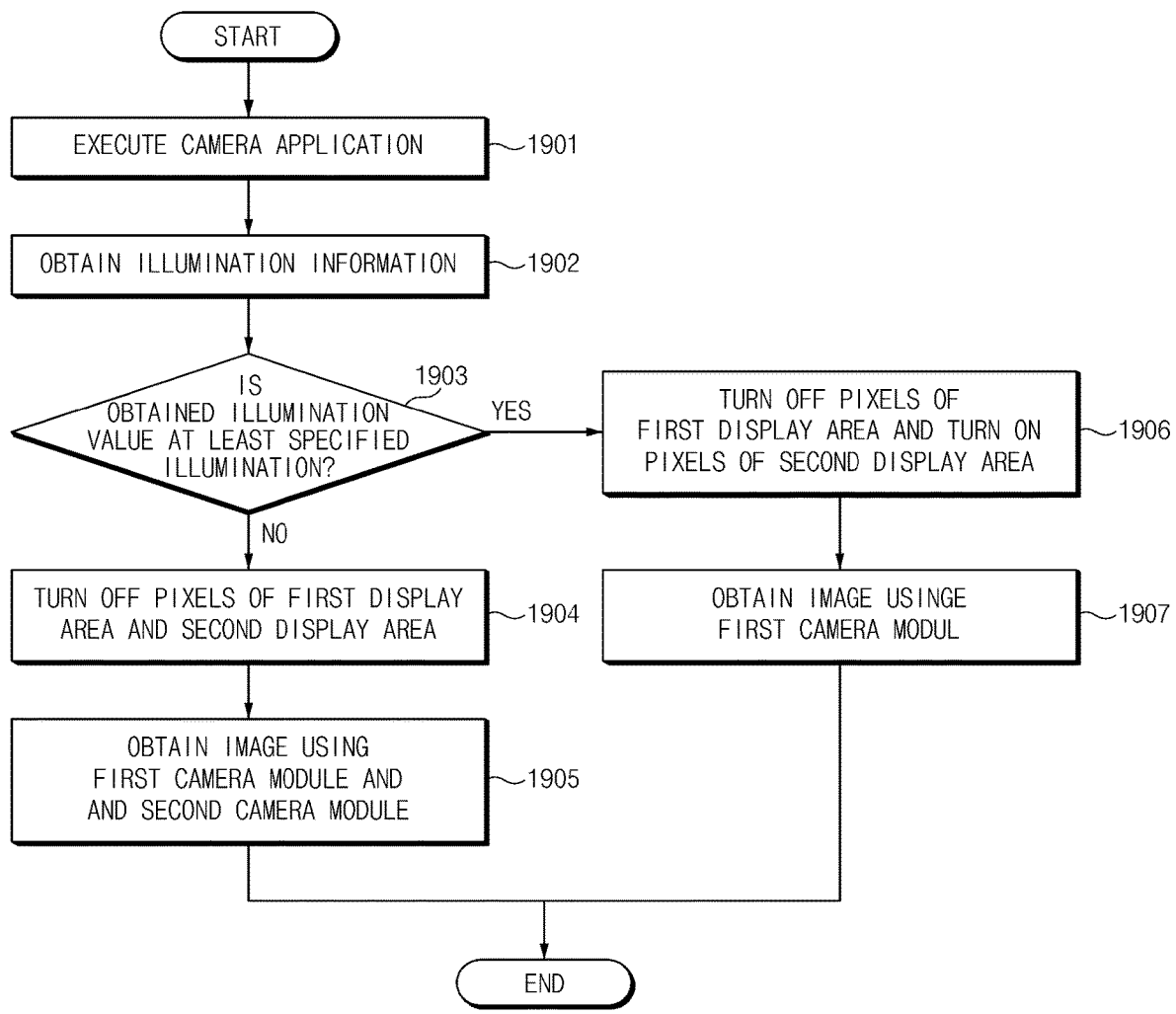
FIG. 19 is a flowchart illustrating an example operation of an electronic device according to various embodiments.

FIG. 19 is a flowchart illustrating an example operation of an electronic device according to various embodiments. In the embodiments described below, operation of the electronic device may be referred to as operation of the processor 120 (see FIG. 1).

In operation 1901, the electronic device according to an embodiment may execute a camera application. The electronic device according to an embodiment may execute the camera application based on a user input.

In operation 1902, the electronic device according to an embodiment may obtain illumination information. For example, the electronic device may obtain the illumination information using a camera module or illumination sensor (e.g., the sensor module 304 of FIG. 3). The illumination information may include an illumination value of the outside of the electronic device. For example, the electronic device according to an embodiment may decrease an illuminance of the fourth display area DA4 to a specified value or less when measuring illumination.

In operation 1903, the electronic device according to an embodiment may determine whether an obtained illumination is at least a specified illumination (e.g., 10000 lux).

If the obtained illumination is less than the specified illumination ("No" in operation 1903), the electronic device according to an embodiment, may turn off the pixels of the first display area DA1 and the second display area DA2 in operation 1904. For example, the processor 120 of the electronic device according to an embodiment may transfer, to the display driver IC 230, a signal configured not to allow the pixels of the first display area DA1 and the second display area DA2 to emit light. Depending on an embodiment, if the obtained illumination is less than the specified illumination, the electronic device may turn off at least a portion of the pixels of the first display area DA1 and the second display area DA2 and may turn on the other pixels.

In operation 1905, the electronic device according to an embodiment may obtain an image using the first camera module 305 arranged in the first display area DA1 and the second camera module 306 arranged in the second display area DA2. The electronic device according to an embodiment may form one piece of content (e.g., image) using both image information obtained using the first camera module 305 and image information obtained using the second camera module 306. For example, the first camera module 305 may be a color camera, and the second camera module 306 may be a black-and-white camera. A first image sensor of the first camera module 305 may include a color filter. A second image sensor of the second camera module 306 may not include a color filter. A transmittance of the second camera module 306 not including a color filter may be greater than a transmittance of the first camera module 305 including a color filter. Since the electronic device according to an embodiment obtains an image using both the first camera module 305 and the second camera module 306, quality of an image obtained when the illumination value is less than the specified illumination may be improved. The electronic device according to an embodiment may obtain an image using the second camera module 306 having a greater transmittance than that of the first camera module 305 together with the first camera module 305 when the illumination value is less than the specified illumination, and thus the quality of an obtained image may be improved.

If the obtained illumination is at least the specified illumination ("Yes" in operation 1903), the electronic device according to an embodiment may turn off the pixels of the first display area DA1 and may turn on the pixels of the second display area DA2 in operation 1906. For example, if the obtained illumination is at least the specified illumination, the electronic device according to an embodiment may turn off only the pixels of the first display area DA1 and may display an image through the second display area DA2. The processor 120 of the electronic device according to an embodiment may transfer, to the display driver IC 230, a signal configured not to allow the pixels of the first display area DA1 to emit light and to allow the pixels of the second display area DA2 to emit light.

In operation 1907, the electronic device according to an embodiment may obtain an image using the first camera module 305 arranged in the first display area DAL For example, the electronic device according to an embodiment may switch the second camera module 306 to an off state. For another example, the electronic device according to an embodiment may obtain an image only using the first camera module 305 while maintaining the second camera module 306 in an on state. The electronic device according to an embodiment may obtain an image by selectively using at least two camera modules based on an external illumination value of the electronic device. As a result, when the external illumination value is at least a specified illumination value, an image may be obtained using a portion of a plurality of camera modules, and an area (e.g., the second display area DA2) of a display panel in which a camera module not used for obtaining an image is arranged may maintain a displayed image.

According to an embodiment, the electronic device may further include the display driver IC 230 electrically connected to the display panel 600 and the processor 120 electrically connected to the display driver IC 230, wherein the processor 120 may be configured to obtain illumination information, transfer, to the display driver IC 230, a signal configured to turn off the pixels of the first display area DA1 and the second display area DA2 when an illumination value of the obtained illumination information is less than a specified illumination, and obtain an image using the first camera module 1060 and the second camera module 1360.

According to an embodiment, the processor 120 may be configured to, when the illumination value of the obtained illumination information is at least the specified illumination, transfer, to the display driver IC 230, a signal configured to turn off the pixels PX of the first display area DA1 and turn on the pixels PX of the second display area DA2, and obtain an image using the first camera module 1060.

According to an embodiment, the processor 120 may be configured to switch the second camera module 1360 to an off state when the illumination value of the obtained illumination information is at least the specified illumination.

Figure 20:
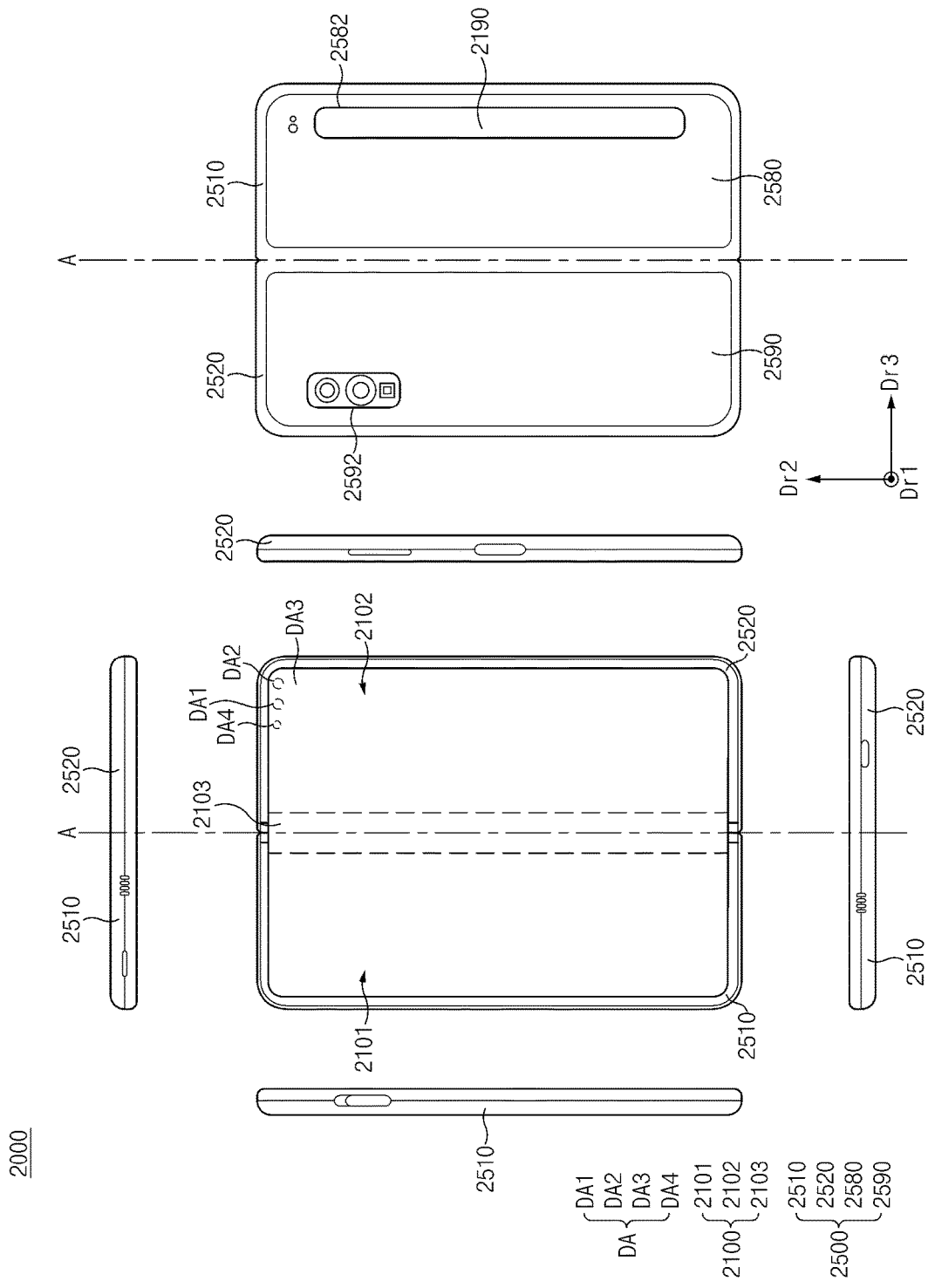
FIG. 20 is a diagram illustrating a flat state of an example foldable electronic device according to various embodiments.
Figure 21:
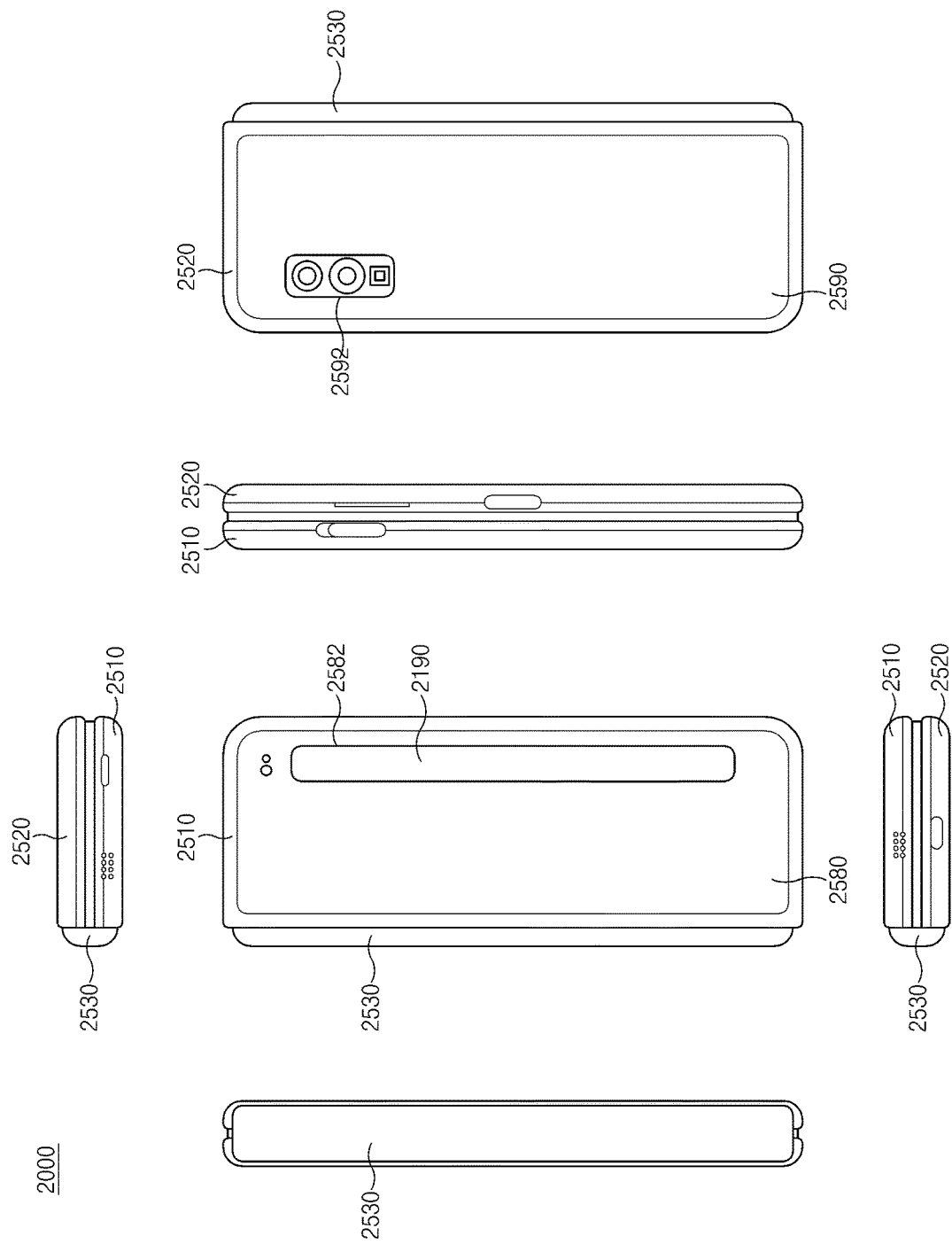
FIG. 21 is a diagram illustrating a folded state of an example foldable electronic device according to various embodiments.

Referring to FIGS. 20 and 21, in an embodiment, an electronic device 2000 may include a foldable housing 2500, a hinge cover 2530 that covers a foldable portion of the foldable housing 2500, and a flexible or foldable display 2100 (hereinafter simply referred to as a "display" 2100) arranged in a space formed by the foldable housing 2500. In the present disclosure, a surface in which the display 2100 is arranged is defined as a first surface or a front surface of the electronic device 2000. Furthermore, an opposite surface of the front surface is defined as a second surface or a rear surface of the electronic device 2000. Furthermore, a surface surrounding a space between the front surface and the rear surface is defined as a third surface or a side surface of the electronic device 2000.

In an embodiment, the foldable housing 2500 may include a first housing structure 2510, a second housing structure 2520, a first rear cover 2580, and a second rear cover 2590. The foldable housing 2500 of the electronic device 2000 is not limited to the shape and coupling illustrated in FIGS. 20 and 21, and may be implemented with other shapes or combination and/or coupling of components. For example, in an embodiment, the first housing structure 2510 and the first rear cover 2580 may be integrally formed, and the second housing structure 2520 and the second rear cover 2590 may be integrally formed.

In the illustrated embodiment, the first housing structure 2510 and the second housing structure 2520 may be arrange side by side with respect to a folding axis (axis A), and may have an approximately symmetric shape with respect to the folding axis A. As described below, an angle or distance between the first housing structure 2510 and the second housing 2520 may vary according to whether the electronic device 200 is in a flat state, a folded state, or an intermediate state. The first housing structure 2510 and the second housing structure 2520 may have shapes symmetrical with each other.

In an embodiment, as illustrated in FIG. 20, the first housing structure 2510 and the second housing structure 2520 may together form a recess accommodating the display 2100. In an embodiment, at least a portion of the first housing structure 2510 and the second housing structure 2520 may be formed of a metallic material or non-metallic material having rigidity of a selected magnitude for supporting the display 2100.

The first rear cover 2580 may be arranged in the rear surface of the electronic device on one side of the folding axis, and, for example, may have a substantially rectangular periphery, which may be covered with the first housing structure 2510. Likewise, the second rear cover 2590 may be arranged in the rear surface of the electronic device on the other side of the folding axis, and may have a periphery, which is covered with the second housing structure 2520.

In the illustrated embodiment, the first rear cover 2580 and the second rear cover 2590 may have a substantially symmetric shape with respect to the folding axis A. However, the first rear cover 2580 and the second rear cover 2590 do not necessarily have symmetrical shapes, and, in an embodiment, the electronic device 2000 may have various shapes of the first rear cover 2580 and the second rear cover 2590. In an embodiment, the first rear cover 2580 may be integrated with the first housing structure 2510, and the second rear cover 2590 may be integrated with the second housing structure 2520.

In an embodiment, the first rear cover 2580, the second rear cover 2590, the first housing structure 2510, and the second housing structure 2520 may form a space in which various components (e.g., a printed circuit board or a battery) of the electronic device 2000 may be arranged. In an embodiment, one or more components may be arranged or visually exposed in the rear surface of the electronic device 2000. For example, at least a portion of a sub-display 2190 may be visually exposed through a first rear area 2582 of the first rear cover 2580. In an embodiment, at least one component or sensor may be visually exposed through a second rear area 2592 of the second rear cover 2590. In various embodiments, the sensor may include a proximity sensor and/or a rear camera.

Referring to FIG. 21, the hinge cover 2530 may be arranged between the first housing structure 2510 and the second housing structure 2520 and may cover internal components (e.g., a hinge structure). In an embodiment, the hinge cover 2530 may be covered with a portion of the first housing structure 2510 and the second housing structure 2520 or exposed to the outside according to a state (flat state or folded state) of the electronic device 2000.

For example, when the electronic device 2000 is in the flat state as illustrated in FIG. 20, the hinge cover 2530 may be covered with the first housing structure 2510 and the second housing structure 2520 and thus may not be exposed to the outside. For example, as illustrated in FIG. 21, when the electronic device 2000 is in the folded state (e.g., fully folded state), the hinge cover 2530 may be exposed to the outside between the first housing structure 2510 and the second housing structure 2520. For example, when the electronic device 2000 is in the intermediate state in which the first housing structure 2510 and the second housing structure 2520 are folded with a certain angle, the hinge cover 2530 may be partially exposed to the outside between the first housing structure 2510 and the second housing structure 2520. In this case, an exposed area may be smaller than an area exposed in the fully folded state. In an embodiment, the hinge cover 2530 may include a curved surface.

The display 2100 may be formed in a space formed by the foldable housing 2500. For example, the display 2100 may be placed in the space formed by the foldable housing 2500 and may form a greater part of the front surface of the electronic device 2000.

Therefore, the front surface of the electronic device 2000 may include the display 2100, a partial area of the first housing structure 2510 adjacent to the display 2100, and a partial area of the second housing structure 2520. Furthermore, the rear surface of the electronic device 2000 may include the first rear cover 2580, a partial area of the first housing structure 2510 adjacent to the first rear cover 2580, the second rear cover 2590, and a partial area of the second housing structure 2520 adjacent to the second rear cover 2590.

The display 2100 may represent a display, at least a portion of which is planar or deformable to a curved surface. In an embodiment, the display 2100 may include a folding area 2103, a first area 2101 arranged on one side (the left side of the folding area 2103 illustrated in FIG. 20) of the folding area 2103, and a second area 2102 arranged on the other side (the right side of the folding area 2103 illustrated in FIG. 20) of the folding area 2103.

The area division of the display 2100 illustrated in FIG. 20 is an example, and the display 2100 may be divided into multiple (e.g., two or at least four) areas according to a structure or function thereof. For example, the area of the display 2100 may be divided by the folding axis A or the folding area 2103 extending in parallel to y axis in the embodiment illustrated in FIG. 20, but, in an embodiment, may be divided by another folding axis (e.g., folding axis parallel to x axis) or another folding area (e.g., folding area parallel to x axis). The first area 2101 and the second area 2102 may have an approximately symmetric shape with respect to the folding area 2103.

The display 2100 may include a display area DA in which an image is displayed through a plurality of pixels. The display area DA may include a first display area DA1, a second display area DA2, a third display area DA3, and a fourth display area DA4. At least a portion of the first display area DA1 of the display 2100 may overlap the first camera module 305 (see FIG. 3) in the first direction Dr1. At least a portion of the second display area DA2 of the display 2100 may overlap the second camera module 306 (see FIG. 3) in the first direction Dr1. At least a portion of the fourth display area DA4 of the display 2100 may overlap the sensor module 304 (see FIG. 3) (e.g., an illumination sensor) in the first direction Dr1. The electronic device 2000 according to an embodiment may display an image since the plurality of pixels PX are arranged in the first display area DA1 overlapping the first camera module 305, the second display area DA2 overlapping the second camera module 306, and the fourth display area DA4 overlapping the sensor module 304. The third display area DA3 may be a portion of the display area DA excluding the first display area DA1, the second display area DA2, and the fourth display area DA4. The first display area DA1, the second display area DA2, and/or the fourth display area DA4 may be surrounded by the third display area DA3. The descriptions provided above with reference to FIGS. 1 to 19 may be referenced in relation to the first display area DA1, the second display area DA2, the third display area DA3, and the fourth display area DA4.

Hereinafter, each area of the display 2100 and operation of the first housing structure 2510 and the second housing structure 2520 according to a state (e.g., flat state and folded state) of the electronic device 2000 will be described.

In an embodiment, when the electronic device 2000 is in the flat state (e.g., see FIG. 20), the first housing structure 2510 and the second housing structure 2520 may form an angle of 180 degrees and may be oriented in the same direction. A surface of the first area 2101 and a surface of the second area 2102 of the display 2100 may form an angle of 180 degrees and may be oriented in the same direction (e.g., the front direction of the electronic device). The folding area 2103 may be flush with the first area 2101 and the second area 2102.

In an embodiment, when the electronic device 2000 is in the folded state (e.g., see FIG. 21), the first housing structure 2510 and the second housing structure 2520 may face each other. The surface of the first area 2101 and the surface of the second area 2102 of the display 2100 may face each other while forming a narrow angle (e.g., between 0 and 10 degrees). At least a portion of the folding area 2103 may include a curved surface having a certain curvature.

In an embodiment, when the electronic device 2000 is in the intermediate state, the first housing structure 2510 and the second housing structure 2520 may be arranged with a certain angle therebetween. The surface of the first area 2101 and the surface of the second area 2102 of the display 2100 may form a smaller angle than that formed in the folded state. At least a portion of the folding area 2103 may include a curved surface having a certain curvature, wherein this curvature may be smaller than that achieved in the folded state.

Figure 22:
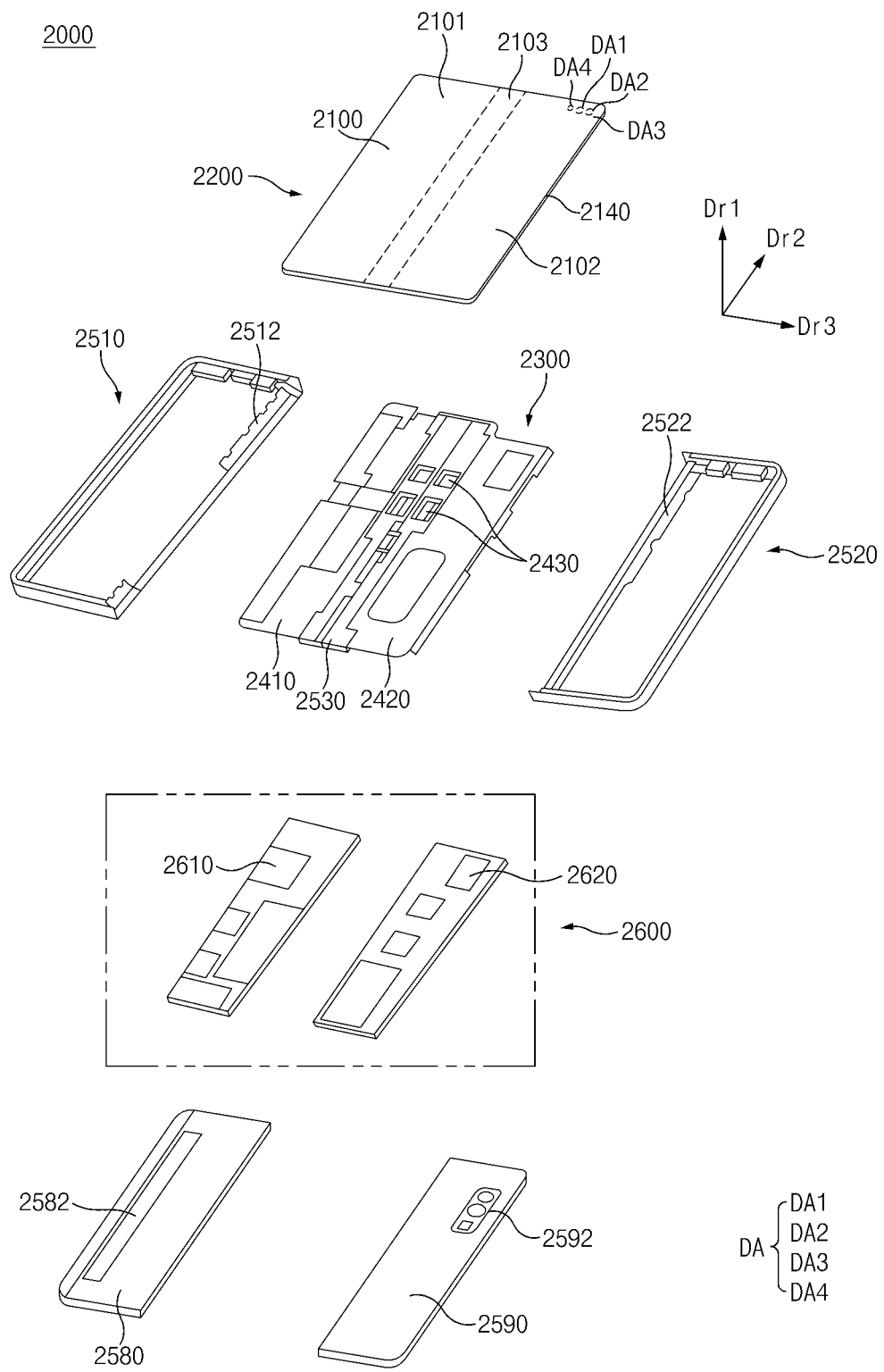
FIG. 22 is an exploded perspective view of an example foldable electronic device according to various embodiments.

FIG. 22 is an exploded perspective view of an example foldable electronic device according to various embodiments.

Referring to FIG. 22, in an embodiment, the electronic device 2000 may include a display unit 2200, a bracket assembly 2300, a substrate unit 2600, the first housing structure 2510, the second housing structure 2520, the first rear cover 2580, and the second rear cover 2590. In the present disclosure, the display unit 2200 may be referred to as a display module or a display assembly.

The display unit 2200 may include the display 2100 and at least one plate or layer 2140 on which the display 2100 is placed. In an embodiment, the plate 2140 may be arranged between the display 2100 and the bracket assembly 2300. The display 2100 may be arranged on at least a portion of one surface (e.g., upper surface based on FIG. 22) of the plate 2140. The plate 2140 may be formed in a shape corresponding to the display 2100.

The bracket assembly 2300 may include a first bracket 2410, a second bracket 2420, a hinge structure arranged between the first bracket 2410 and the second bracket 2420, the hinge cover 2530 that covers the hinge structure when viewed from the outside, and a wiring member 2430 (e.g., a flexible printed circuit board (FPCB)) crossing the first bracket 2410 and the second bracket 2420.

In an embodiment, the bracket assembly 2300 may be arranged between the plate 2140 and the substrate unit 2600. For example, the first bracket 2410 may be arranged between the first area 2101 of the display 2100 and a first substrate 2610. The second bracket 2420 may be arranged between the second area 2102 of the display 2100 and a second substrate 2620.

In an embodiment, at least a portion of the wiring member 2430 and the hinge structure may be arranged in the bracket assembly 2300. The wiring member 2430 may be arranged in a direction (e.g., x axis direction) crossing the first bracket 2410 and the second bracket 2420. The wiring member 2430 may be arranged in a direction (e.g., x axis direction) perpendicular to a folding axis (e.g., y axis or the folding axis A of FIG. 20) of the folding area 2103 of the electronic device 2000.

As described above, the substrate unit 2600 may include the first substrate 2610 arranged on a side of the first bracket 2410 and the second substrate 2620 arranged on a side of the second bracket 2420. The first substrate 2610 and the second substrate 2620 may be arranged in a space formed by the bracket assembly 2300, the first housing structure 2510, the second housing structure 2520, the first rear cover 2580, and the second rear cover 2590. Components for implementing various functions of the electronic device 2000 may be mounted on the first substrate 2610 and the second substrate 2620.

The first housing structure 2510 and the second housing structure 2520 may be assembled so as to be coupled to both sides of the bracket assembly 2300 in a state in which the display unit 220 is coupled to the bracket assembly 2300. As described below, the first housing structure 2510 and the second housing structure 2520 may slide on both sides of the bracket assembly 2300 so as to be coupled to the bracket assembly 2300.

In an embodiment, the first housing structure 2510 may include a first rotation support surface 2512, and the second housing structure 2520 may include a second rotation support surface 2522 corresponding to the first rotation support surface 2512. The first rotation support surface 2512 and the second rotation support surface 2522 may include a curved surface corresponding to the curved surface included in the hinge cover 2530.

In an embodiment, when the electronic device 2000 is in the flat state (e.g., the electronic device of FIG. 20), the first rotation support surface 2512 and the second rotation support surface 2522 may cover the hinge cover 2530 so that the hinge cover 2530 may not be exposed or may be minimally exposed to the rear surface of the electronic device 2000. When the electronic device 2000 is in the folded state (e.g., the electronic device of FIG. 21), the first rotation support surface 2512 and the second rotation support surface 2522 may rotate along the curved surface included in the hinge cover 2530 so that the hinge cover 2530 may be maximally exposed to the rear surface of the electronic device 2000.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory storage medium" refers to a tangible device, and may not include a signal (e.g., an electromagnetic wave), but this term does not differentiate between where data is semi-permanently stored in the storage medium and where the data is temporarily stored in the storage medium. For example, "the non-transitory storage medium" may include a buffer where data is temporally stored.

According to an embodiment, a method according to various embodiments of the disclosure may be included and provided in a computer program product. The computer program product may be traded as a product between a seller and a buyer. The computer program product (e.g., downloadable app)) may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, a size of a non-display area of a display may be reduced in an electronic device.

According to various embodiments, pixel density of a display area of a display is varied according to characteristics of a camera module so that the quality of an image obtained using the camera module may be improved.

According to various embodiments, an image may be obtained by selectively using at least two camera modules based on an external illumination value of an electronic device.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a display panel including a display area in which a plurality of pixels are arranged and configured to display an image in a first direction;
   an illumination sensor arranged under the display panel; and
   a first camera module including camera circuitry and a second camera module including camera circuitry arranged under the display panel,
   wherein the display area includes a first display area overlapping the first camera module in the first direction, a second display area overlapping the second camera module in the first direction, a third display area surrounding the first display area and the second display area, and a fourth display area overlapping the illumination sensor in the first direction,
   wherein pixels per inch (PPI) of the first display area is less than the PPI of the second display area, and
   wherein the PPI of the fourth display area is greater than the PPI of the second display area and less than the PPI of the third display area.

2. The electronic device of claim 1,
   wherein the display panel further includes a first light shielding member comprising a light shielding material arranged in the first display area,
   wherein the first light shielding member includes a plurality of first openings.

3. The electronic device of claim 2,
   wherein the display panel further includes a second light shielding member comprising a light shielding material arranged in the second display area,
   wherein the second light shielding member includes a plurality of second openings.

4. The electronic device of claim 3, wherein a shape of the plurality of first openings is different from a shape of the plurality of second openings.

5. The electronic device of claim 3,
   wherein the first display area and the second display area include a transmission area in which pixels are not disposed, and
   wherein the plurality of first openings of the first light shielding member and the plurality of second openings of the second light shielding member are provided in the transmission area.

6. The electronic device of claim 3,
   wherein the display panel further includes:
   a substrate; and
   a pixel circuit layer disposed on the substrate, and
   wherein the first light shielding member and the second light shielding member are disposed between the substrate and the pixel circuit layer.

7. The electronic device of claim 6, wherein the first light shielding member and the second light shielding member are not electrically connected to the pixel circuit layer.

8. The electronic device of claim 1, further comprising:
   a display driver integrated circuit (IC) electrically connected to the display panel,
   and
   wherein the display driver IC is configured to supply pixels of the second display area with a signal configured to cause pixels of the second display area to emit brighter light than pixels of the third display area, and to supply pixels of the first display area with a signal configured to cause pixels of the first display area to emit brighter light than pixels of the second display area.

9. The electronic device of claim 1,
   wherein the third display area surrounds the fourth display area.

10. The electronic device of claim 9, further comprising:
    a display driver integrated circuit (IC) electrically connected to the display panel,
    wherein the display driver IC is configured to supply pixels of the fourth display area with a signal configured to cause pixels of the fourth display area to emit brighter light than pixels of the third display area, to supply pixels of the second display area with a signal configured to cause pixels of the second display area to emit brighter light than pixels of the fourth display area, and to supply pixels of the first display area with a signal configured to cause pixels of the first display area to emit brighter light than pixels of the second display area.

11. The electronic device of claim 1, further comprising:
    a display driver integrated circuit (IC) electrically connected to the display panel; and
    a processor electrically connected to the display driver IC,
    wherein the processor is configured to control the electronic device to:
    obtain illumination information, and
    transfer, to the display driver IC, a signal configured to turn off pixels of the first display area and pixels of the second display area based on an illumination value of the obtained illumination information being less than a specified illumination, and to obtain an image using the first camera module and the second camera module.

12. The electronic device of claim 11, wherein the processor is configured to control the electronic device, based on the illumination value of the obtained illumination information being at least the specified illumination, transfer, to the display driver IC, a signal configured to turn off the pixels of the first display area and turn on the pixels of the second display area, and to obtain an image using the first camera module.

13. The electronic device of claim 1,
    wherein the display area further includes a third display area surrounding the first display area and the second display area,
    wherein the PPI of the second display area is less than the PPI of the third display area.

14. The electronic device of claim 1, wherein the first camera module includes a color camera configured to obtain a color image, and the second camera module includes a black-and-white camera configured to obtain a black-and-white image.

15. An electronic device comprising:
a display panel including a display area in which a plurality of pixels are arranged and configured to display an image in a first direction,
a display driver integrated circuit (IC) electrically connected to the display panel, and
a processor electrically connected to the display driver IC; and
a first camera module including camera circuitry and a second camera module including camera circuitry arranged under the display panel,
wherein the display area includes a first display area overlapping the first camera module in the first direction and a second display area overlapping the second camera module in the first direction,
wherein pixels per inch (PPI) of the first display area is less than the PPI of the second display area, and
wherein the processor is configured to control the electronic device to:
obtain illumination information,
transfer, to the display driver IC, a signal configured to turn off pixels of the first display area and pixels of the second display area based on an illumination value regarding the obtained illumination information being less than a specified illumination, and to obtain an image via the first camera module and the second camera module,
based on the illumination value regarding the obtained illumination information being at least the specified illumination, transfer, to the display driver IC, a signal configured to turn off the pixels of the first display area and turn on the pixels of the second display area, and to obtain an image via the first camera module, and
switch the second camera module to an off state based on the illumination value regarding of the obtained illumination information being at least the specified illumination.

16. An electronic device comprising:
a display panel including a display area in which a plurality of pixels are arranged and configured to display an image in a first direction;
an illumination sensor arranged under the display panel;
a display driver integrated circuit (IC) electrically connected to the display panel;
a processor electrically connected to the display driver IC; and
a first camera module including camera circuitry and a second camera module including camera circuitry arranged under the display panel and configured to obtain an image using light transmitted through the display panel,
wherein the display area includes a first display area overlapping the first camera module in the first direction, a second display area overlapping the second camera module in the first direction, a third display area surrounding the first display area and the second display area, and a fourth display area overlapping the illumination sensor in the first direction,
wherein pixels per inch (PPI) of the first display area is less than the PPI of the second display area and the PPI of the fourth display area is greater than the PPI of the second display area and less than the PPI of the third display area, and
wherein the processor is configured to control the electronic device to obtain an image using at least one of the first camera module or the second camera module.

17. The electronic device of claim 16,
wherein the display panel further includes a first light shielding member comprising a light shielding material arranged in the first display area,
wherein the first light shielding member includes a plurality of first openings.

18. The electronic device of claim 17,
wherein the display panel further includes a second light shielding member comprising a light shielding material arranged in the second display area,
wherein the second light shielding member includes a plurality of second openings.

19. The electronic device of claim 18,
wherein the first display area and the second display area include a transmission area in which pixels are not disposed, and
wherein the plurality of first openings of the first light shielding member and the plurality of second openings of the second light shielding member are provided in the transmission area.

20. The electronic device of claim 19, wherein the first light shielding member and the second light shielding member are spaced apart.

* * * * *